United States Patent
Nakajima et al.

(10) Patent No.: US 9,941,044 B2
(45) Date of Patent: Apr. 10, 2018

(54) INSULATION TYPE STEP-DOWN CONVERTER

(71) Applicant: MITSUBISHI ELECTRIC CORPORATION, Chiyoda-ku, Tokyo (JP)

(72) Inventors: Koji Nakajima, Tokyo (JP); Takashi Kumagai, Tokyo (JP); Yuji Shirakata, Tokyo (JP); Yujiro Kido, Tokyo (JP); Kenji Nishizaka, Tokyo (JP)

(73) Assignee: MITSUBISHI ELECTRIC CORPORATION, Chiyoda-Ku, Tokyo (JP)

( * ) Notice: Subject to any disclaimer, the term of this patent is extended or adjusted under 35 U.S.C. 154(b) by 0 days.

(21) Appl. No.: 15/541,400

(22) PCT Filed: Feb. 19, 2016

(86) PCT No.: PCT/JP2016/054814
§ 371 (c)(1),
(2) Date: Jul. 3, 2017

(87) PCT Pub. No.: WO2016/158064
PCT Pub. Date: Oct. 6, 2016

(65) Prior Publication Data
US 2018/0025828 A1    Jan. 25, 2018

(30) Foreign Application Priority Data
Mar. 27, 2015 (JP) .................................. 2015-066176

(51) Int. Cl.
*H01F 27/28* (2006.01)
*H02M 3/335* (2006.01)
(Continued)

(52) U.S. Cl.
CPC ..... *H01F 27/2804* (2013.01); *H01F 27/2876* (2013.01); *H02M 3/33507* (2013.01);
(Continued)

(58) Field of Classification Search
CPC ........ H02M 1/088; H02M 3/22; H02M 3/325; H02M 3/335; H02M 3/33507;
(Continued)

(56) References Cited

U.S. PATENT DOCUMENTS

| 2004/0190314 A1* | 9/2004 | Yoshida | H02M 3/285 363/65 |
| 2005/0122746 A1* | 6/2005 | Nagel | H02M 1/088 363/15 |

(Continued)

FOREIGN PATENT DOCUMENTS

| JP | 2004-303857 A | 10/2004 |
| JP | 2008-178205 A | 7/2008 |

(Continued)

OTHER PUBLICATIONS

International Search Report (PCT/ISA/210) dated May 10, 2016, by the Japanese Patent Office as the International Searching Authority for International Application No. PCT/JP2016/054814.
(Continued)

*Primary Examiner* — Adolf Berhane
(74) *Attorney, Agent, or Firm* — Buchanan Ingersoll & Rooney PC

(57) ABSTRACT

An insulation type step-down converter includes first and second step-down transformers each of which includes an input-side coil and an output-side coil. An intermediate portion of the output-side coil of the first step-down transformer and an intermediate portion of the output-side coil of the second step-down transformer are connected to each other. First, second, third, and fourth rectifier elements are
(Continued)

connected in series with first, second, third, and fourth output-side coils, respectively. Smoothing coils are connected to the first to fourth output-side coils. The first, second, third, and fourth rectifier elements are connected such that electric currents flow simultaneously in the first output-side coil and the third output-side coil, and electric currents flow simultaneously in the second output-side coil and the fourth output-side coil in a manner alternating with the electric currents in the first output-side coil and the third output-side coil.

9 Claims, 27 Drawing Sheets

(51) Int. Cl.
    *H05K 1/11*           (2006.01)
    *H05K 1/02*           (2006.01)

(52) U.S. Cl.
    CPC ........... *H05K 1/0298* (2013.01); *H05K 1/115* (2013.01); *H01F 2027/2809* (2013.01); *H01F 2027/2819* (2013.01)

(58) Field of Classification Search
    CPC ......... H02M 3/33569; H02M 3/33561; H02M 7/5387; H02M 7/003; H02M 7/153; H02M 7/521; H02M 7/53871; H01L 25/112; H01L 25/115
    USPC .... 363/15–17, 56.02, 65, 67–69, 95, 97, 98, 363/131, 132, 144
    See application file for complete search history.

(56) References Cited

U.S. PATENT DOCUMENTS

| | | | |
|---|---|---|---|
| 2008/0247195 | A1 | 10/2008 | Nakahori |
| 2009/0290385 | A1* | 11/2009 | Jungreis ............... H02M 1/4241 363/17 |
| 2014/0204617 | A1* | 7/2014 | Itou ................... H02M 3/33507 363/17 |
| 2014/0241012 | A1* | 8/2014 | Lindberg-Poulsen ......................... H02M 3/33523 363/17 |
| 2017/0310228 | A1* | 10/2017 | Nakajima ......... H02M 3/33569 |

FOREIGN PATENT DOCUMENTS

| | | |
|---|---|---|
| JP | 2008-259387 A | 10/2008 |
| JP | 2011-077328 A | 4/2011 |
| JP | 2014-90523 A | 5/2014 |

OTHER PUBLICATIONS

Written Opinion (PCT/ISA/237) dated May 10, 2016, by the Japanese Patent Office as the International Searching Authority for International Application No. PCT/JP2016/054814.

Notification of Reasons for Refusal dated Dec. 5, 2017 issued by the Japanese Patent Office in corresponding Japanese Patent Application No. 2017-509370 and English translation (6 pages).

* cited by examiner

US 9,941,044 B2

INSULATION TYPE STEP-DOWN CONVERTER

TECHNICAL FIELD

The present invention relates to an insulation type step-down converter, and more particularly to an insulation type step-down converter which produces a DC low voltage from a DC high voltage.

BACKGROUND ART

In Japanese Patent Laying-Open No. 2008-178205 (PTD 1), for example, a step-down transformer is divided into two parts, where two input-side coils are connected in series as an input-side circuit and two smoothing coils are connected in parallel as an output-side circuit.

CITATION LIST

Patent Document

PTD 1: Japanese Patent Laying-Open No. 2008-178205

SUMMARY OF INVENTION

Technical Problem

In Japanese Patent Laying-Open No. 2008-178205, a smoothing coil is divided into two parts to distribute electric current, which allows for reduction and distribution of the amount of generated heat. In Japanese Patent Laying-Open No. 2008-178205, however, due to unbalance between voltages applied to the respective input-side coils of the two step-down transformers, and coupling unbalance between the input-side coils and the output-side coils of the step-down transformers, electric currents flowing in the two smoothing coils may not become equal, causing unbalance between values of these electric currents. It is thus required to leave a margin corresponding to the unbalance in the smoothing coils. As used herein, leaving a margin means designing a large current-carrying cross section of a winding of each smoothing coil, from the viewpoint of suppressing excessive temperature increase in one of two smoothing coils resulting from larger electric current flowing in the one of the smoothing coils than the other smoothing coil.

In addition, electric currents flowing in the respective output-side coils of the two step-down transformers may also not become equal, causing unbalance between temperatures of the respective output-side coils of the two step-down transformers. As a result, the temperatures of the respective output-side coils of the two step-down transformers may not become equal and may become unbalanced. It is thus required to leave a margin corresponding to the unbalance in the output-side coils. As used herein, leaving a margin means designing a large current-carrying cross section of a winding of each output-side coil, from the viewpoint of suppressing excessive temperature increase in the output-side coil of one of two step-down transformers resulting from larger electric current flowing in the output-side coil of the one of the two step-down transformers than the output-side coil of the other step-down transformer.

However, this may increase the smoothing coils and the step-down transformers in size, which runs counter to the trend toward higher integration of semiconductor devices.

The present invention was made in view of the above-described problem, and has an object to provide an insulation type step-down converter in which values of electric currents flowing in two divided smoothing coils can be made equal, and temperatures of respective output-side coils of two step-down transformers can be made equal, to reduce the smoothing coils and the step-down transformers in size.

Solution to Problem

An insulation type step-down converter of the present invention includes first and second step-down transformers each of which includes an input-side coil and an output-side coil. An intermediate portion of the output-side coil of the first step-down transformer and an intermediate portion of the output-side coil of the second step-down transformer are connected to each other. First, second, third, and fourth rectifier elements are connected in series with first, second, third, and fourth output-side coils, respectively. Smoothing coils are connected to the first to fourth output-side coils. The first, second, third, and fourth rectifier elements are connected such that electric currents flow simultaneously in the first output-side coil and the third output-side coil, and electric currents flow simultaneously in the second output-side coil and the fourth output-side coil in a manner alternating with the electric currents in the first output-side coil and the third output-side coil.

Advantageous Effects of Invention

According to the present invention, since the values of electric currents flowing in the two smoothing coils can be made equal, and the temperatures of the respective output-side coils of the two step-down transformers can be made equal, the smoothing coils and the step-down transformers can be reduced in size.

BRIEF DESCRIPTION OF DRAWINGS

FIG. 4 shows a schematic diagram (A) showing a pattern of the lowermost layer of input-side and output-side coils constituting the step-down transformer of the first embodiment shown in the circuit block diagram of FIG. 1, and a direction of a magnetic flux when an input-side drive circuit is in a first state, a schematic diagram (B) showing a pattern of the second lowermost layer of the input-side and output-side coils in the first state of the first embodiment and the like, a schematic diagram (C) showing a pattern of the third lowermost layer of the input-side and output-side coils in the first state of the first embodiment and the like, and a schematic diagram (D) showing a pattern of the fourth lowermost layer of the input-side and output-side coils in the first state of the first embodiment and the like.

FIG. 5 shows a schematic diagram (A) showing a pattern of the lowermost layer of the input-side and output-side coils constituting the step-down transformer of the first embodiment shown in the circuit block diagram of FIG. 1, and a direction of a magnetic flux when the input-side drive circuit is in a second state, a schematic diagram (B) showing a pattern of the second lowermost layer of the input-side and output-side coils in the second state of the first embodiment and the like, a schematic diagram (C) showing a pattern of the third lowermost layer of the input-side and output-side coils in the second state of the first embodiment and the like, and a schematic diagram (D) showing a pattern of the fourth lowermost layer of the input-side and output-side coils in the second state of the first embodiment and the like.

FIG. 9 shows a schematic diagram (A) showing a pattern of the lowermost layer of input-side and output-side coils constituting the step-down transformer of the second embodiment, and a direction of a magnetic flux when an input-side drive circuit is in a first state, a schematic diagram (B) showing a pattern of the second lowermost layer of the input-side and output-side coils in the first state of the second embodiment and the like, a schematic diagram (C) showing a pattern of the third lowermost layer of the input-side and output-side coils in the first state of the second embodiment and the like, and a schematic diagram (D) showing a pattern of the fourth lowermost layer of the input-side and output-side coils in the first state of the second embodiment and the like.

FIG. 10 shows a schematic diagram (A) showing a pattern of the lowermost layer of the input-side and output-side coils constituting the step-down transformer of the second embodiment, and a direction of a magnetic flux when the input-side drive circuit is in a second state, a schematic diagram (B) showing a pattern of the second lowermost layer of the input-side and output-side coils in the second state of the second embodiment and the like, a schematic diagram (C) showing a pattern of the third lowermost layer of the input-side and output-side coils in the second state of the second embodiment and the like, and a schematic diagram (D) showing a pattern of the fourth lowermost layer of the input-side and output-side coils in the second state of the second embodiment and the like.

FIG. 13 shows a schematic diagram (A) showing a pattern of the lowermost layer of input-side and output-side coils constituting a step-down transformer of the third embodiment shown in the circuit block diagram of FIG. 12, and a direction of a magnetic flux when an input-side drive circuit is in a first state, a schematic diagram (B) showing a pattern of the second lowermost layer of the input-side and output-side coils in the first state of the third embodiment and the like, a schematic diagram (C) showing a pattern of the third lowermost layer of the input-side and output-side coils in the first state of the third embodiment and the like, and a schematic diagram (D) showing a pattern of the fourth lowermost layer of the input-side and output-side coils in the first state of the third embodiment and the like.

FIG. 14 shows a schematic diagram (A) showing a pattern of the lowermost layer of the input-side and output-side coils constituting the step-down transformer of the third embodiment shown in the circuit block diagram of FIG. 12, and a direction of a magnetic flux when the input-side drive circuit is in a second state, a schematic diagram (B) showing a pattern of the second lowermost layer of the input-side and output-side coils in the second state of the third embodiment and the like, a schematic diagram (C) showing a pattern of the third lowermost layer of the input-side and output-side coils in the second state of the third embodiment and the like, and a schematic diagram (D) showing a pattern of the fourth lowermost layer of the input-side and output-side coils in the second state of the third embodiment and the like.

FIG. 15 shows a schematic diagram (A) showing a pattern of the lowermost layer of input-side and output-side coils constituting a step-down transformer of a fourth embodiment, and a direction of a magnetic flux when an input-side drive circuit is in a first state, a schematic diagram (B) showing a pattern of the second lowermost layer of the input-side and output-side coils in the first state of the fourth embodiment and the like, a schematic diagram (C) showing a pattern of the third lowermost layer of the input-side and output-side coils in the first state of the fourth embodiment and the like, and a schematic diagram (D) showing a pattern of the fourth lowermost layer of the input-side and output-side coils in the first state of the fourth embodiment and the like.

FIG. 16 shows a schematic diagram (A) showing a pattern of the lowermost layer of the input-side and output-side coils constituting the step-down transformer of the fourth embodiment, and a direction of a magnetic flux when the input-side drive circuit is in a second state, a schematic diagram (B) showing a pattern of the second lowermost layer of the input-side and output-side coils in the second state of the fourth embodiment and the like, a schematic diagram (C) showing a pattern of the third lowermost layer of the input-side and output-side coils in the second state of the fourth embodiment and the like, and a schematic diagram (D) showing a pattern of the fourth lowermost layer of the input-side and output-side coils in the second state of the fourth embodiment and the like.

FIG. 19 shows a schematic diagram (A) showing a pattern of the lowermost layer of input-side and output-side coils constituting the step-down transformer of the fifth embodiment, and a direction of a magnetic flux when an input-side drive circuit is in a first state, a schematic diagram (B) showing a pattern of the second lowermost layer of the input-side and output-side coils in the first state of the fifth embodiment and the like, a schematic diagram (C) showing a pattern of the third lowermost layer of the input-side and output-side coils in the first state of the fifth embodiment and the like, and a schematic diagram (D) showing a pattern of the fourth lowermost layer of the input-side and output-side coils in the first state of the fifth embodiment and the like.

showing a pattern of the second lowermost layer of the input-side and output-side coils in the second state of the fifth embodiment and the like, a schematic diagram (C) showing a pattern of the third lowermost layer of the input-side and output-side coils in the second state of the fifth embodiment and the like, and a schematic diagram (D) showing a pattern of the fourth lowermost layer of the input-side and output-side coils in the second state of the fifth embodiment and the like.

Figure 17:
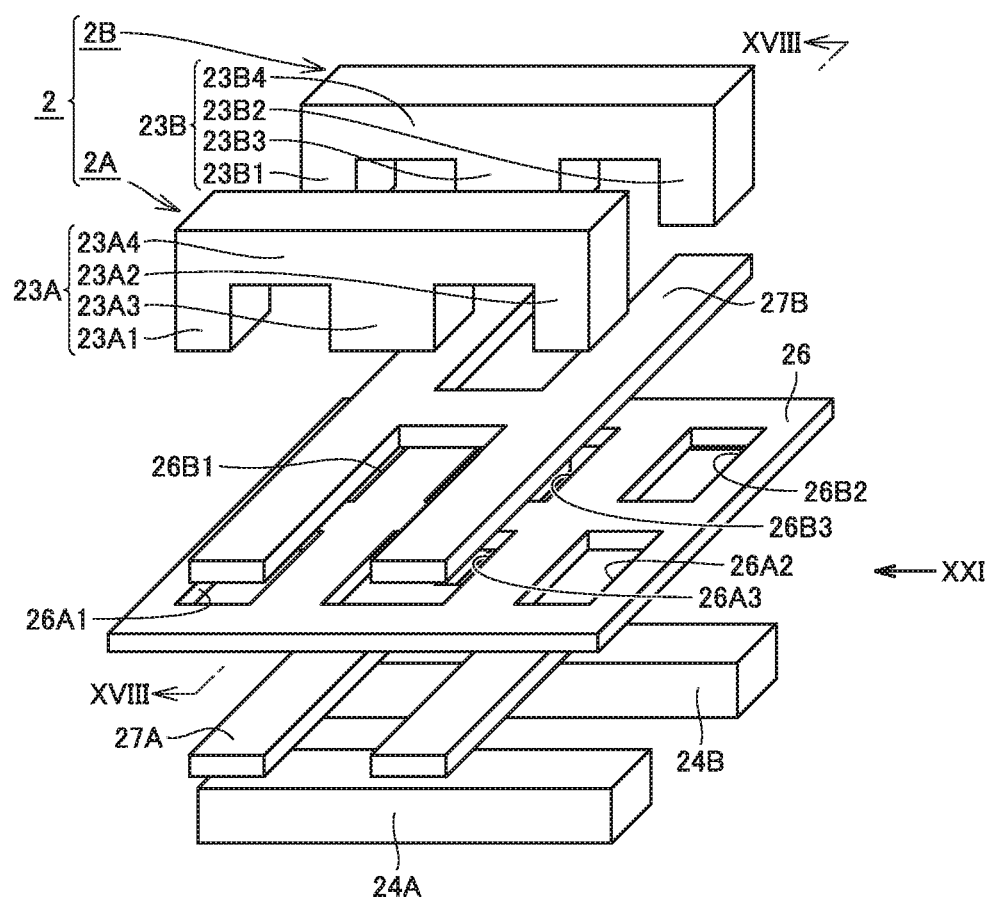
FIG. 17 is an exploded perspective view showing arrangement of cores and a multilayer printed board constituting a step-down transformer of a fifth embodiment.
Figure 21:
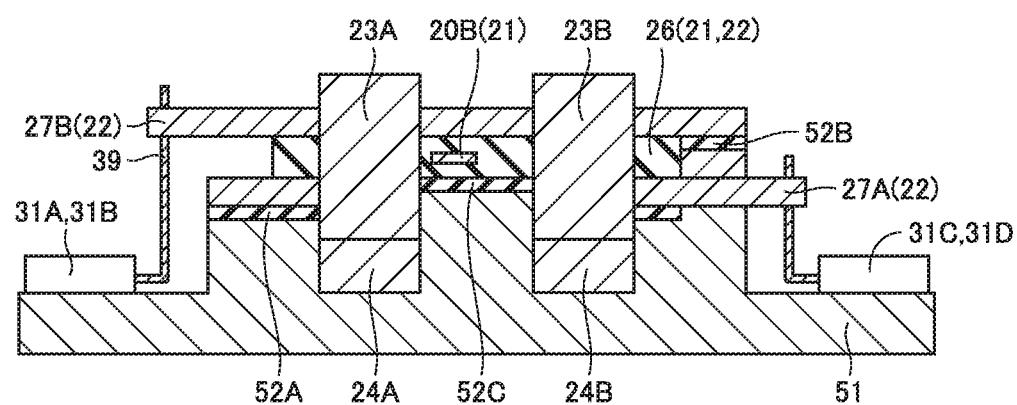

FIG. 21 is a schematic projection view seen from a direction XXI indicated by the arrow in FIG. 17, upon assembly of the portion shown in FIG. 17 in the fifth embodiment.

Figure 22:
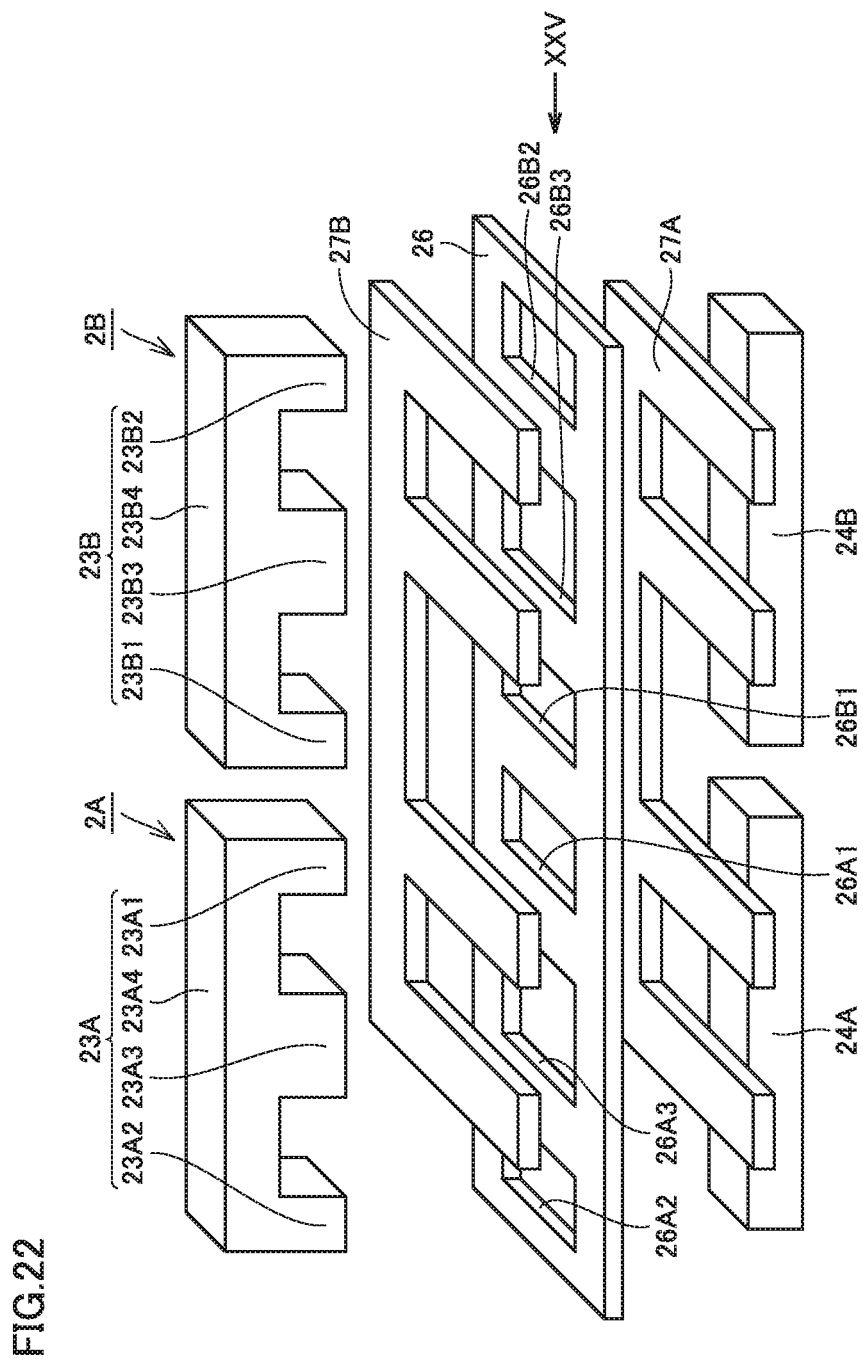

FIG. 22 is an exploded perspective view showing arrangement of cores and a multilayer printed board constituting a step-down transformer of a sixth embodiment.

Figure 23:
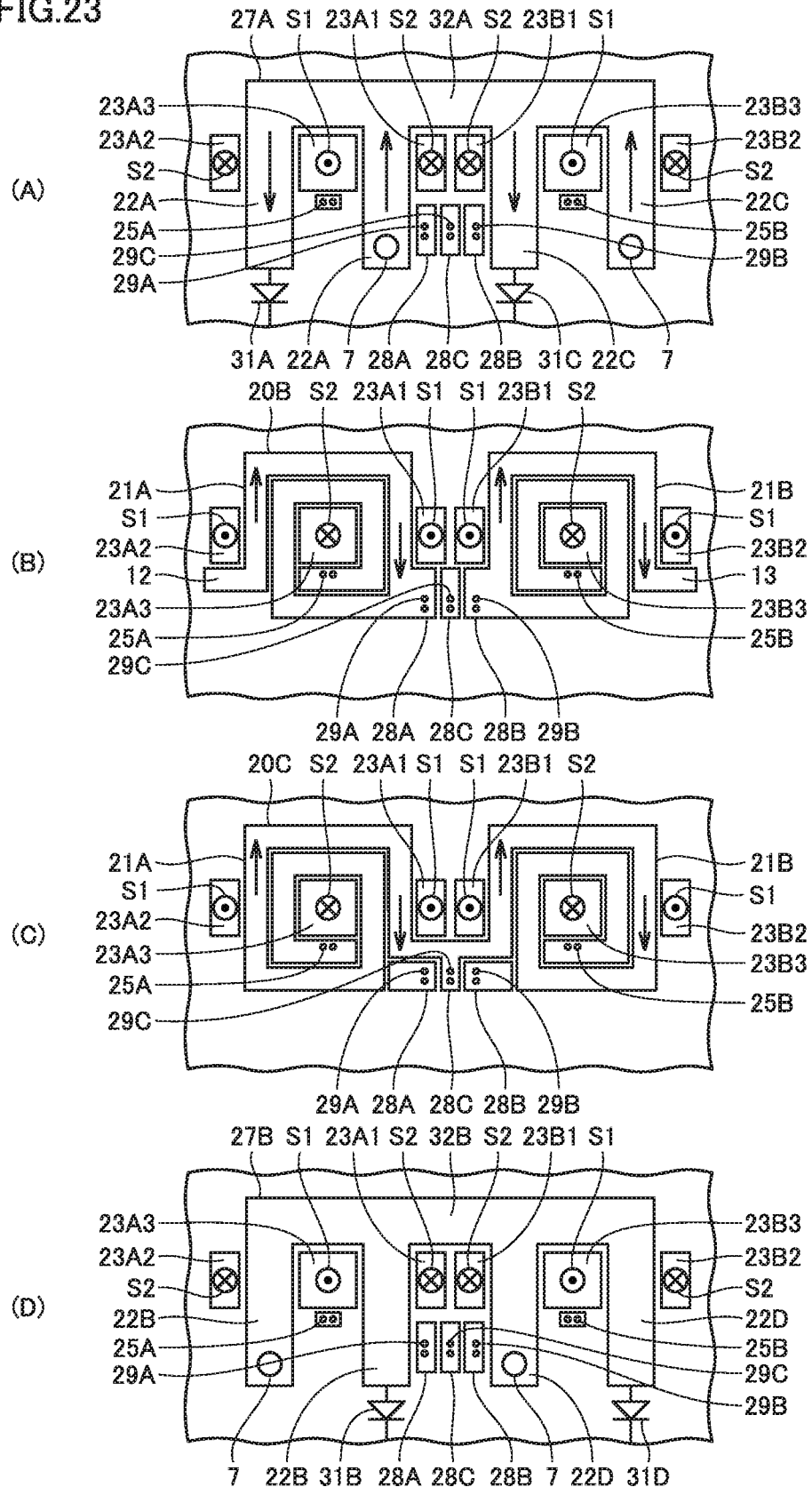

FIG. 23 shows a schematic diagram (A) showing a pattern of the lowermost layer of input-side and output-side coils constituting the step-down transformer of the sixth embodiment, and a direction of a magnetic flux when an input-side drive circuit is in a first state, a schematic diagram (B) showing a pattern of the second lowermost layer of the input-side and output-side coils in the first state of the sixth embodiment and the like, a schematic diagram (C) showing a pattern of the third lowermost layer of the input-side and output-side coils in the first state of the sixth embodiment and the like, and a schematic diagram (D) showing a pattern of the fourth lowermost layer of the input-side and output-side coils in the first state of the sixth embodiment and the like.

Figure 24:
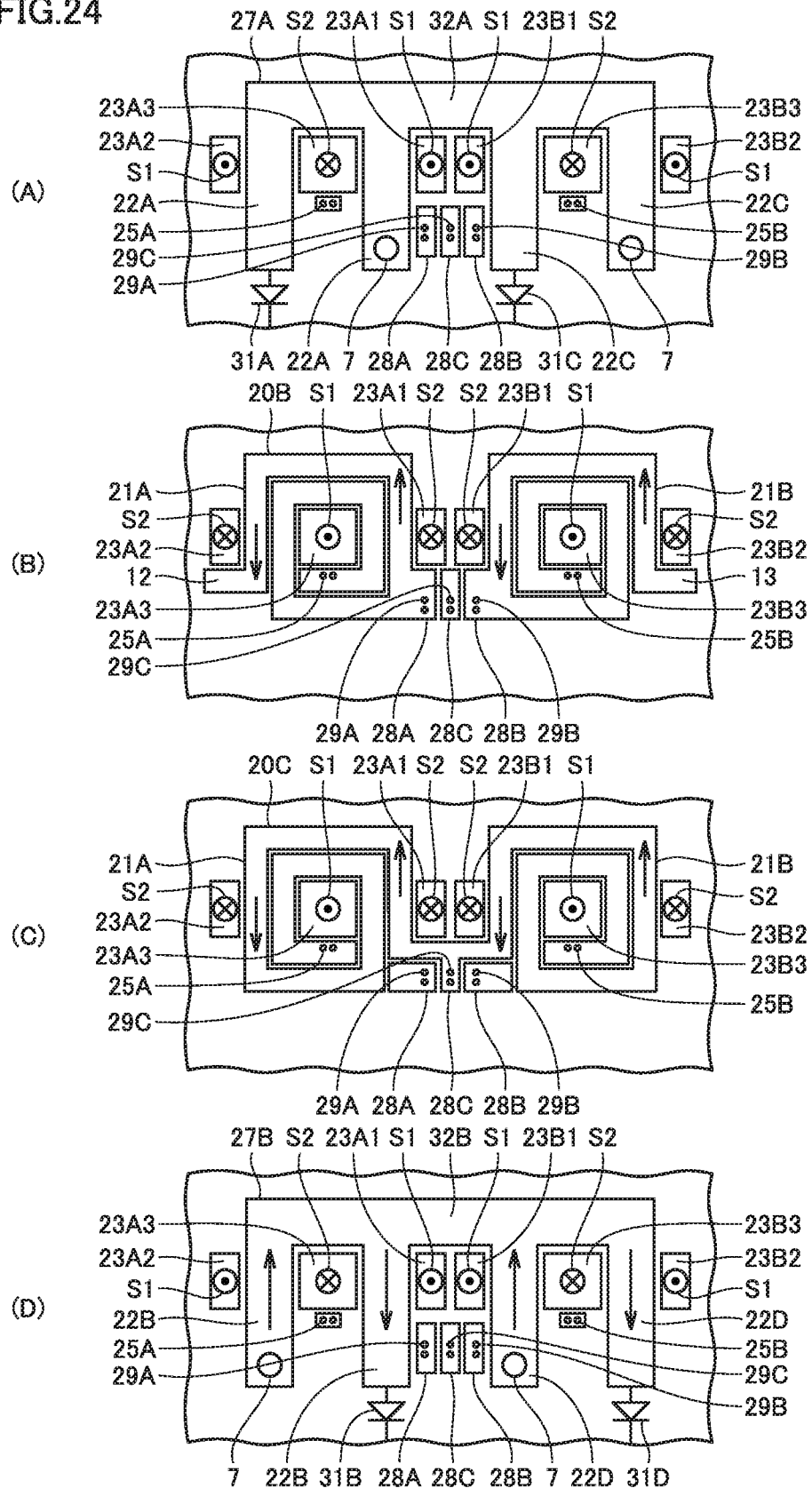

FIG. 24 shows a schematic diagram (A) showing a pattern of the lowermost layer of the input-side and output-side coils constituting the step-down transformer of the sixth embodiment, and a direction of a magnetic flux when the input-side drive circuit is in a second state, a schematic diagram (B) showing a pattern of the second lowermost layer of the input-side and output-side coils in the second state of the sixth embodiment and the like, a schematic diagram (C) showing a pattern of the third lowermost layer of the input-side and output-side coils in the second state of the sixth embodiment and the like, and a schematic diagram (D) showing a pattern of the fourth lowermost layer of the input-side and output-side coils in the second state of the sixth embodiment and the like.

Figure 25:
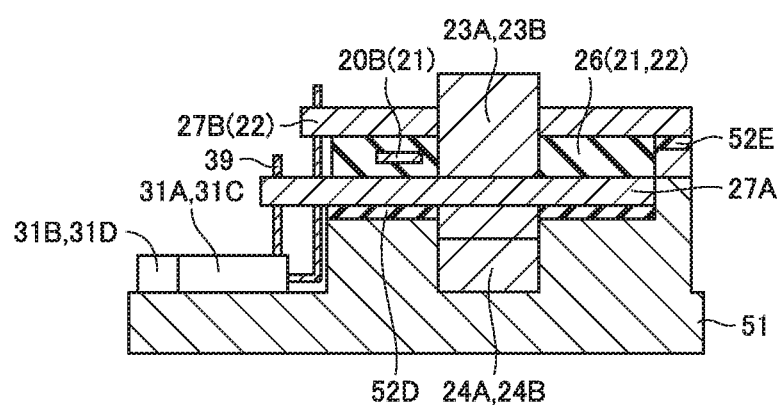

FIG. 25 is a schematic projection view seen from a direction XXV indicated by the arrow in FIG. 22, upon assembly of the portion shown in FIG. 22 in the sixth embodiment.

Figure 26:
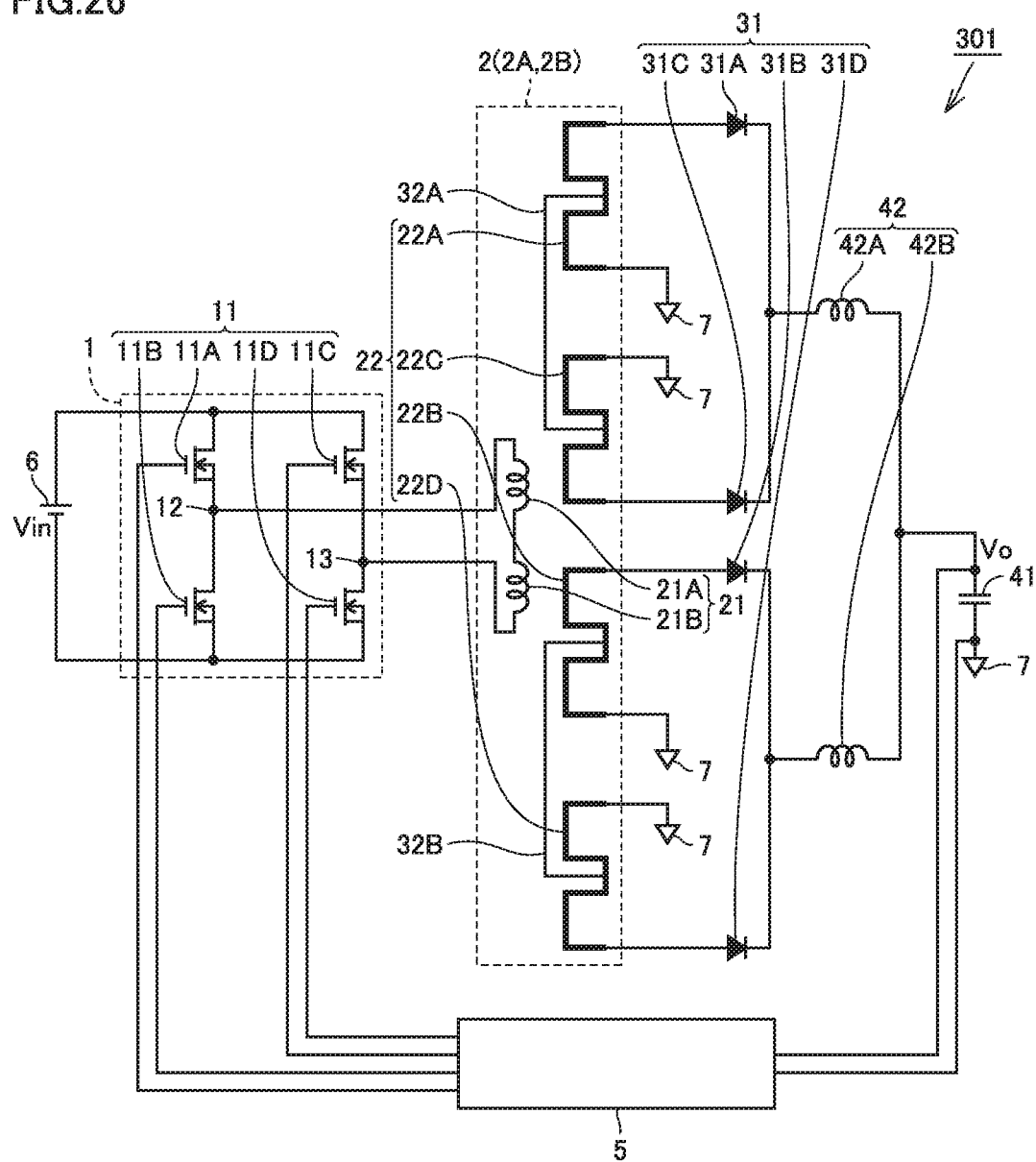

FIG. 26 is a circuit block diagram of an insulation type step-down converter of a seventh embodiment.

Figure 27:
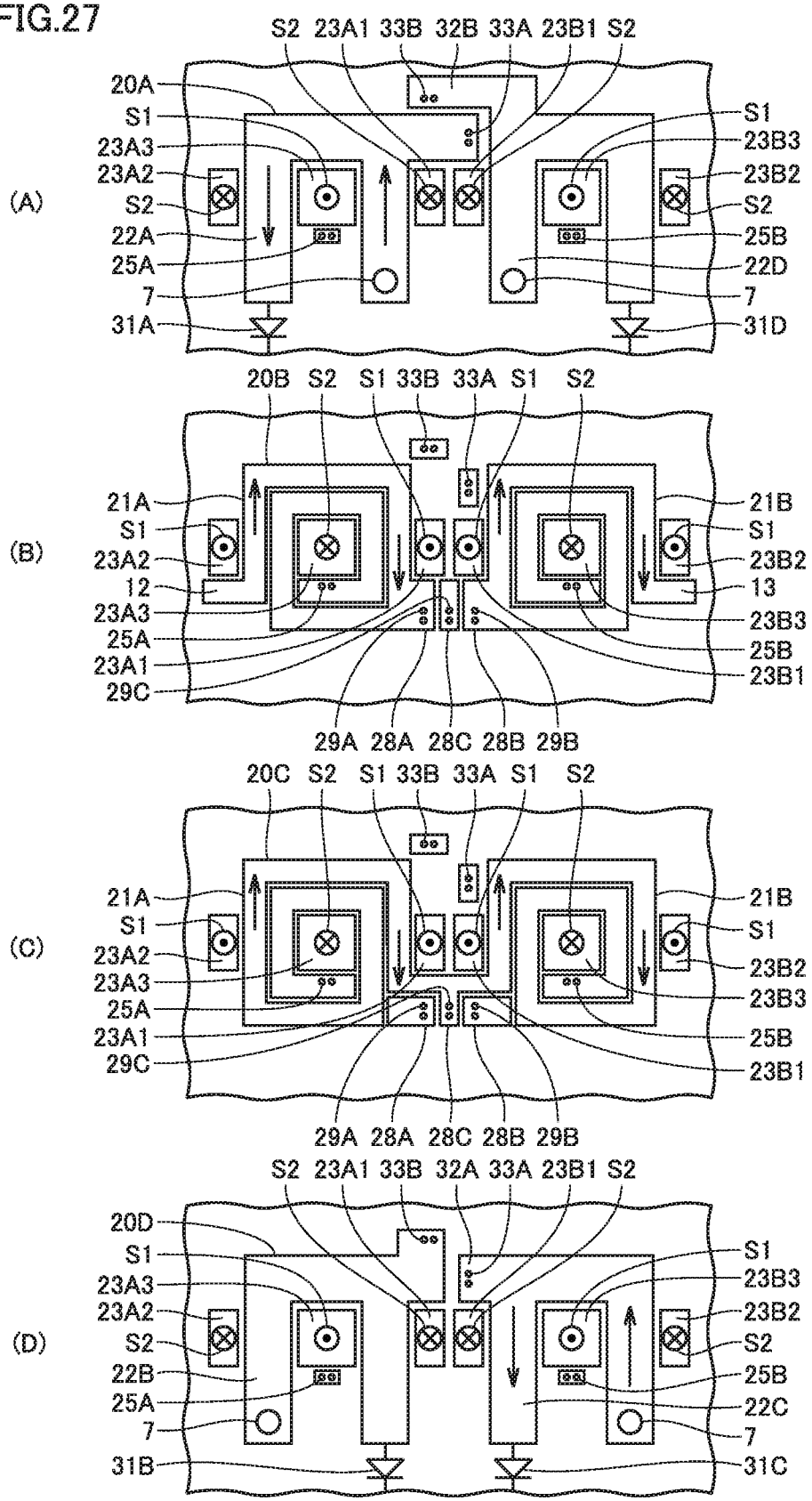

FIG. 27 shows a schematic diagram (A) showing a pattern of the lowermost layer of input-side and output-side coils constituting a step-down transformer of an eighth embodiment, and a direction of a magnetic flux when an input-side drive circuit is in a first state, a schematic diagram (B) showing a pattern of the second lowermost layer of the input-side and output-side coils in the first state of the eighth embodiment and the like, a schematic diagram (C) showing a pattern of the third lowermost layer of the input-side and output-side coils in the first state of the eighth embodiment and the like, and a schematic diagram (D) showing a pattern of the fourth lowermost layer of the input-side and output-side coils in the first state of the eighth embodiment and the like.

Figure 28:
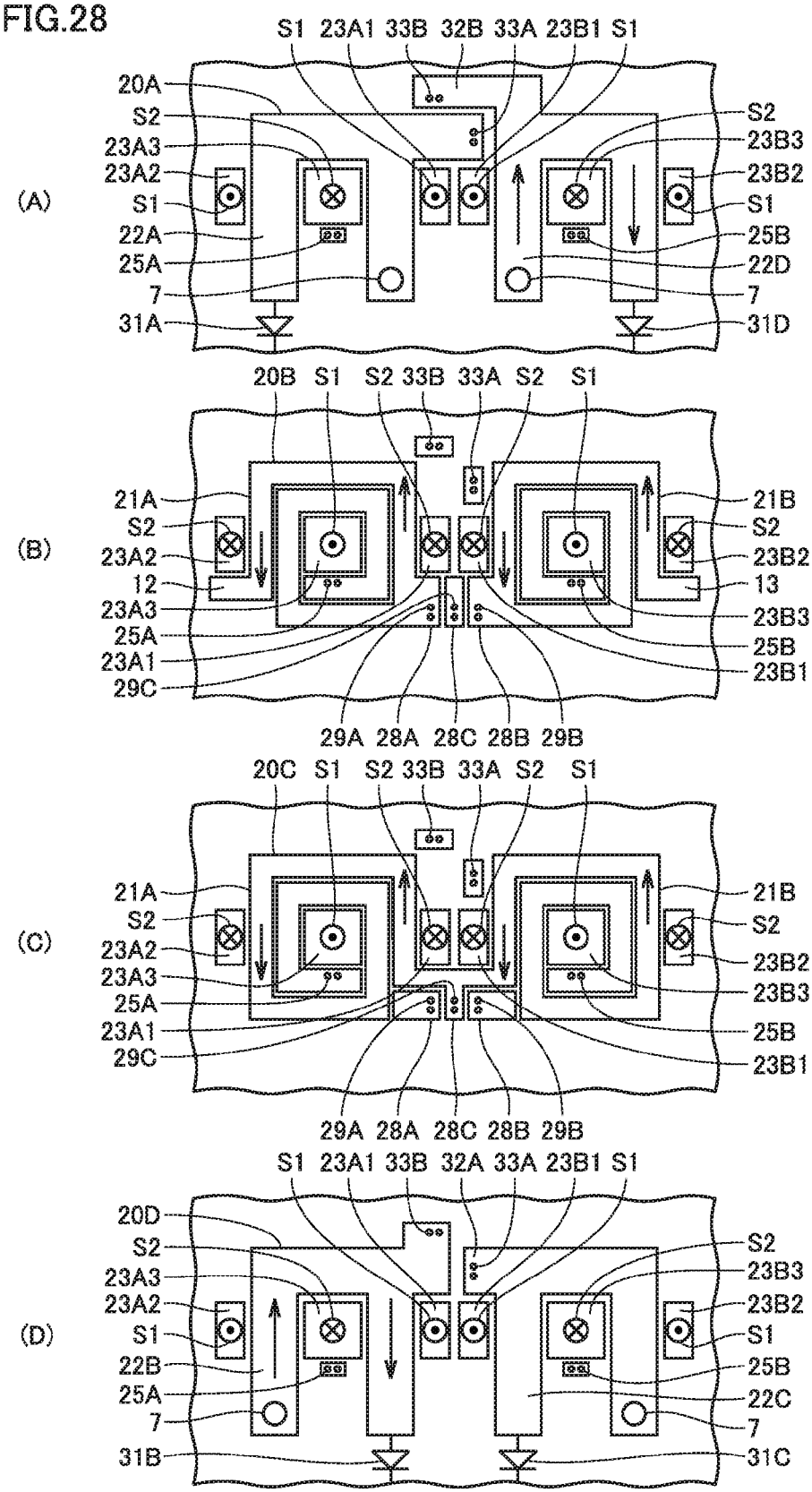

FIG. 28 shows a schematic diagram (A) showing a pattern of the lowermost layer of the input-side and output-side coils constituting the step-down transformer of the eighth embodiment, and a direction of a magnetic flux when the input-side drive circuit is in a second state, a schematic diagram (B) showing a pattern of the second lowermost layer of the input-side and output-side coils in the second state of the eighth embodiment and the like, a schematic diagram (C) showing a pattern of the third lowermost layer of the input-side and output-side coils in the second state of the eighth embodiment and the like, and a schematic diagram (D) showing a pattern of the fourth lowermost layer of the input-side and output-side coils in the second state of the eighth embodiment and the like.

Figure 29:
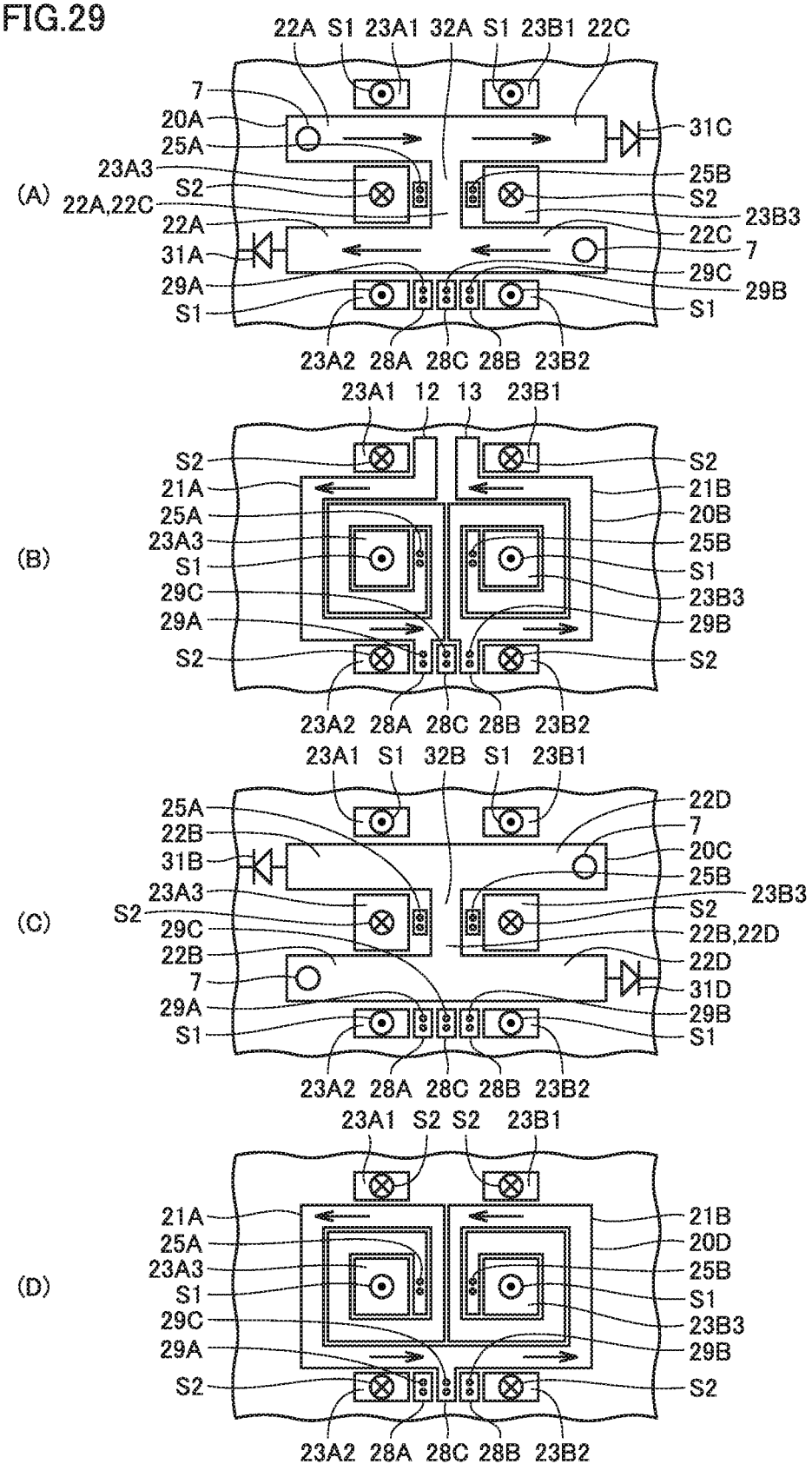

FIG. 29 shows a schematic diagram (A) showing a pattern of the lowermost layer of input-side and output-side coils constituting a step-down transformer of a ninth embodiment, and a direction of a magnetic flux when an input-side drive circuit is in a first state, a schematic diagram (B) showing a pattern of the second lowermost layer of the input-side and output-side coils in the first state of the ninth embodiment and the like, a schematic diagram (C) showing a pattern of the third lowermost layer of the input-side and output-side coils in the first state of the ninth embodiment and the like, and a schematic diagram (D) showing a pattern of the fourth lowermost layer of the input-side and output-side coils in the first state of the ninth embodiment and the like.

DESCRIPTION OF EMBODIMENTS

Hereinafter, embodiments of the present invention will be described based on the drawings.

First Embodiment

First, a block diagram of a circuit constituting an insulation type step-down converter of the present embodiment will be described using FIG. 1.

Figure 1:
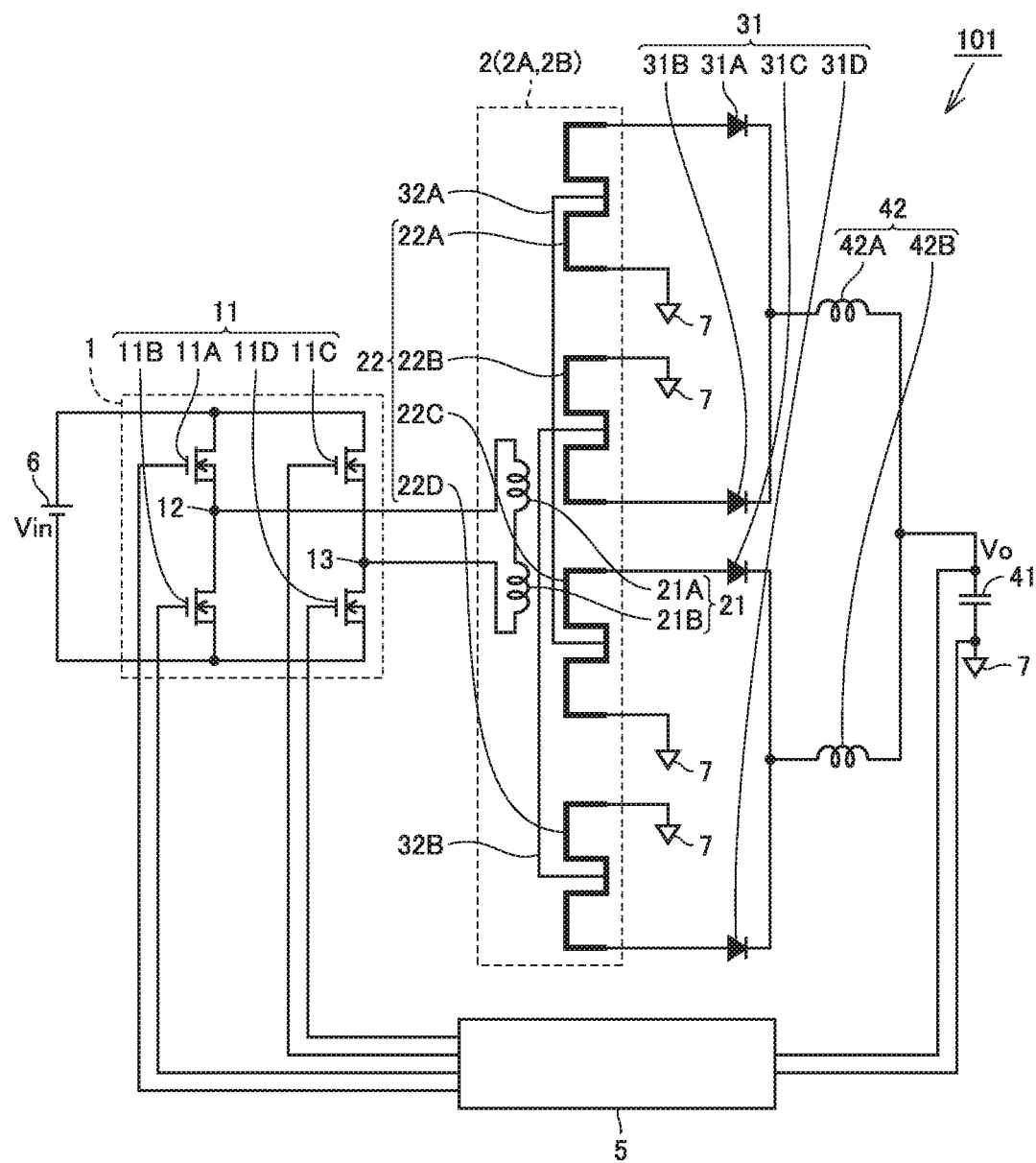
FIG. 1 is a circuit block diagram of an insulation type step-down converter of a first embodiment.

Referring to FIG. 1, an insulation type step-down converter 101 of the present embodiment mainly has an input-side drive circuit 1, a step-down transformer 2, a rectifier element 31, a smoothing coil 42, and a control circuit 5.

Input-side drive circuit 1 has four switching elements 11A, 11B, 11C, and 11D (which will be collectively called a switching element 11). Step-down transformer 2 has a step-down transformer 2A (first step-down transformer) and a step-down transformer 2B (second step-down transformer). Rectifier element 31 has four rectifier elements 31A, 31B, 31C, and 31D. Smoothing coil 42 has a smoothing coil 42A (first smoothing coil) and a smoothing coil 42B (second smoothing coil).

In input-side drive circuit 1, switching element 11 is connected as shown in FIG. 1. Specifically, switching elements 11A and 11B connected in series and switching elements 11C and 11D connected in series are connected in parallel. A node 12 exists between switching elements 11A and 11B, and a node 13 exists between switching elements 11C and 11D. An input-side coil 21A (first input-side coil) and an input-side coil 21B (second input-side coil) connected in series with each other and serving as an input-side coil 21 are connected across nodes 12 and 13.

Since switching element 11 is connected to control circuit 5, switching elements 11A to 11D are controlled by control circuit 5 so as to be alternately turned on and off. Specifically, a first state in which switching elements 11A and 11D are turned on and a second state in which switching elements 11B and 11C are turned on are brought about alternately at regular time intervals. Accordingly, in input-side drive circuit 1, an input voltage from a voltage Vin of a DC power supply 6 is applied to input-side coils 21A and 21B in opposite directions to each other in the first state and the second state (so as to be a positive voltage in one state and a negative voltage in the other state). Thus, a circuit in which the direction of electric current is changed over time using DC power supply 6 can be formed by input-side drive circuit 1.

As described above, switching element 11 constitutes a so-called full bridge circuit by four switching elements 11A to 11D. However, the mode of switching element 11 is not limited to that shown in FIG. 1 as long as a voltage can be applied alternately to input-side coil 21 in opposite directions to each other in the first state and the second state, and a so-called half bridge circuit implemented by two switching elements, for example, may be adopted.

Step-down transformers 2A and 2B have four output-side coils 22A (first output-side coil), 22B (second output-side coil), 22C (third output-side coil), and 22D (fourth output-side coil), as an output-side coil 22. One of a pair of ends of output-side coil 22A is connected to a reference potential 7 on the output side of insulation type step-down converter 101, and the other end is connected to the anode of rectifier element 31A.

Similarly, one of a pair of ends of output-side coil 22B is connected to reference potential 7 on the output side of insulation type step-down converter 101, and the other end is connected to the anode of rectifier element 31B. One of a pair of ends of output-side coil 22C is connected to reference potential 7 on the output side of insulation type step-down converter 101, and the other end is connected to the anode of rectifier element 31C. One of a pair of ends of output-side coil 22D is connected to reference potential 7 on the output side of insulation type step-down converter 101, and the other end is connected to the anode of rectifier element 31D.

The cathode of each of rectifier elements 31A and 31B is connected to smoothing coil 42A, and the cathode of each of rectifier elements 31C and 31D is connected to smoothing coil 42B. An end of a pair of ends of each of smoothing coils 42A and 42B opposite to the end connected to rectifier elements 31A to 31D is connected to a smoothing capacitor 41. An output voltage Vo of insulation type step-down converter 101 is applied between both ends of smoothing capacitor 41.

Output-side coils 22A and 22B constitute step-down transformer 2A, and output-side coils 22C and 22D constitute step-down transformer 2B. An intermediate portion of output-side coil 22A and an intermediate portion of output-side coil 22C are connected to each other at an intermediate connection portion 32A, and an intermediate portion of output-side coil 22B and an intermediate portion of output-side coil 22D are connected to each other at an intermediate connection portion 32B.

Next, the structure of each component constituting step-down transformer 2 in the present embodiment will be described using FIGS. 2 to 5. First, an overall structure of step-down transformer 2 will be briefly described using FIGS. 2 to 3.

Figure 2:
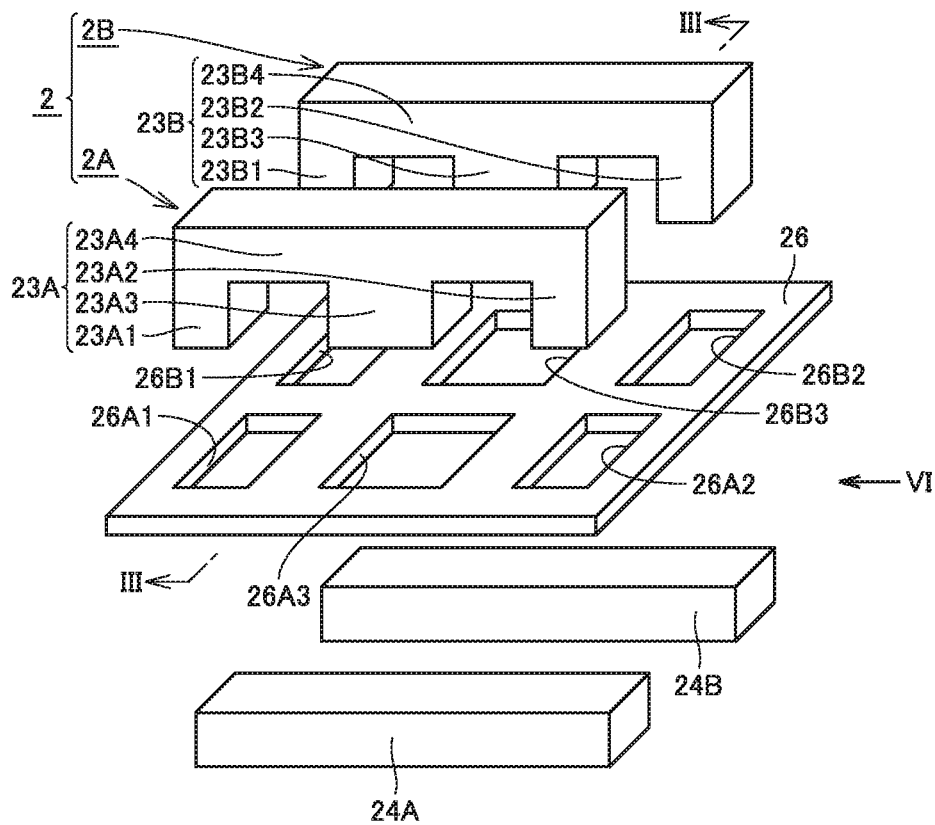
FIG. 2 is an exploded perspective view showing arrangement of cores and a multilayer printed board constituting a step-down transformer of the first embodiment.

Referring to FIG. 2, step-down transformer 2 of the present embodiment mainly has, as step-down transformer 2A, an E-shaped core 23A (first core), an I-shaped core 24A, and a multilayer printed board 26. Step-down transformer 2 has, as step-down transformer 2B, an E-shaped core 23B (second core), an I-shaped core 24B, and multilayer printed board 26. Step-down transformers 2A and 2B are arranged to be aligned with each other (in the horizontal direction, for example). Step-down transformers 2A and 2B share multilayer printed board 26.

E-shaped core 23A has outer legs 23A1, 23A2, a middle leg 23A3, and a core coupling part 23A4 shown in FIG. 2. Outer legs 23A1, 23A2 and middle leg 23A3 extend downward in FIG. 2 from core coupling part 23A4, and core coupling part 23A4 is a region extending in the horizontal direction in FIG. 2. E-shaped core 23B has outer legs 23B1, 23B2, a middle leg 23B3, and a core coupling part 23B4 shown in FIG. 2. Outer legs 23B1, 23B2 and middle leg 23B3 extend downward in FIG. 2 from core coupling part 23B4, and core coupling part 23B4 is a region extending in the horizontal direction in FIG. 2. It is noted that FIG. 2 is an exploded perspective view merely showing arrangement of the above-described respective components, not a mode in which these respective components have been assembled in step-down transformer 2 finally.

Outer leg 23A1 (first one outer leg) of E-shaped core 23A extends in the same direction as middle leg 23A3 (first middle leg), that is, downward in FIG. 2, and is spaced from middle leg 23A3 (in the horizontal direction in FIG. 2). Outer leg 23A2 (first other outer leg) is spaced from middle leg 23A3 (in the horizontal direction in FIG. 2) opposite to outer leg 23A1 with respect to middle leg 23A3 (i.e., on the right side of middle leg 23A3 in FIG. 2). That is, two outer legs 23A1 and 23A2 in E-shaped core 23A are arranged to sandwich middle leg 23A3 from the right and left sides in FIG. 2. Core coupling part 23A4 is a portion extending in the direction (horizontal direction in FIG. 2) crossing the direction in which outer legs 23A1, 23A2 and middle leg 23A3 extend such that outer legs 23A1, 23A2 and middle leg 23A3 extending in the vertical direction in FIG. 2 are connected to each other at their upper ends.

Similarly, outer leg 23B1 (second one outer leg) of E-shaped core 23B extends in the same direction as middle leg 23B3 (second middle leg), that is, downward in FIG. 2, and is spaced from middle leg 23B3 (in the horizontal direction in FIG. 2). Outer leg 23B2 (second other outer leg) is spaced from middle leg 23B3 (in the horizontal direction in FIG. 2) opposite to outer leg 23B1 with respect to middle leg 23B3 (i.e., on the right side of middle leg 23B3 in FIG. 2). That is, two outer legs 23B1 and 23B2 in E-shaped core 23B are arranged to sandwich middle leg 23B3 from the right and left sides in FIG. 2. Core coupling part 23B4 is a portion extending in the direction (horizontal direction in FIG. 2) crossing the direction in which outer legs 23B1, 23B2 and middle leg 23B3 extend such that outer legs 23B1, 23B2 and middle leg 23B3 extending in the vertical direction in FIG. 2 are connected to each other at their upper ends.

In FIG. 2, the cross section crossing the direction in which middle legs 23A3 and 23B3 extend is larger than the cross section crossing the direction in which outer legs 23A1, 23A2, 23B1, and 23B2 extend. More specifically, the cross sections of outer legs 23A1, 23B1 and outer legs 23A2, 23B2 in FIG. 2 are almost equal in area, and the sum of the areas of the cross sections of two outer legs 23A1 and 23A2 (the sum of the areas of the cross sections of outer legs 23B1 and 23B2) is almost equal to the area of the cross section of middle leg 23A3 (middle leg 23B3). However, this mode is not a limitation.

E-shaped cores 23A and 23B each have a shape just like the character of "E" when seen from the front side in FIG. 2.

In FIG. 2, E-shaped core 23A has outer leg 23A1, middle leg 23A3 and outer leg 23A2 aligned in this order from the left side to the right side in the drawing, and E-shaped core 23B has outer leg 23B1, middle leg 23B3 and outer leg 23B2 aligned in this order from the left side to the right side in the drawing. Accordingly, in the depth direction in FIG. 2, outer legs 23A1 and 23B1 are arranged to face each other, outers legs 23A2 and 23B2 are arranged to face each other, and middle legs 23A3 and 23B3 are arranged to face each other. However, this mode is not a limitation, but outer legs 23A1 and 23B2, for example, may be arranged to face each other.

I-shaped cores 24A and 24B each have a rectangular parallelepiped shape extending in the horizontal direction in the drawing similarly to core coupling parts 23A4 and 23B4. Preferably, E-shaped core 23A and I-shaped core 24A, and E-shaped core 23B and I-shaped core 24B each have a rectangular shape (long shape) in a congruence relationship with each other when FIG. 2 as a whole is seen from above (seen in plan view). By mounting E-shaped cores 23A and 23B on the surfaces of I-shaped cores 24A and 24B so as to come into contact with the surfaces, E-shaped cores 23A, 23B and I-shaped cores 24A, 24B serve as a set constituting step-down transformers 2A and 2B.

It is noted that both E-shaped cores 23A, 23B and I-shaped cores 24A, 24B are preferably made of generally-known ferrite or the like.

Multilayer printed board 26 is a flat plate-like component having a rectangular shape in plan view, for example. Multilayer printed board 26 has six through-holes 26A1, 26A2, 26A3, 26B1, 26B2, and 26B3, for example, spaced from each other and formed in a matrix in a manner to extend through multilayer printed board 26 from one main surface (the upper side in the drawing) to the other main surface (the lower side in the drawing).

Multilayer printed board 26 arranged to be sandwiched between E-shaped core 23A and I-shaped core 24A is set such that outer leg 23A1 is inserted through through-hole 26A1, outer leg 23A2 is inserted through through-hole 26A2, and middle leg 23A3 is inserted through through-hole 26A3. Outer and middle legs 23A1, 23A2, and 23A3 are fixed such that their terminal ends (on the lowermost part in FIG. 2) are mounted on the surface of the long shape of I-shaped core 24. Step-down transformer 2A is thereby assembled such that outer legs 23A1, 23A2 and part of middle leg 23A3 of E-shaped core 23A are inserted through through-holes 26A1, 26A2, and 26A3, respectively. Similarly, multilayer printed board 26 is set such that outer leg 23B1 is inserted through through-hole 26B1, outer leg 23B2 is inserted through through-hole 26B2, and middle leg 23B3 is inserted through through-hole 26B3. Assembled step-down transformer 2A has two magnetic paths, one formed by outer leg 23A1 and middle leg 23A3, the other formed by outer leg 23A2 and middle leg 23A3. The same applies to step-down transformer 2B.

It is noted that two magnetic paths are formed here by combining an E-shaped core and an I-shaped core, but this is not a limitation. A step-down transformer having two magnetic paths may be assembled by combining two E-shaped cores or combining two EER type cores, for example.

Figure 3:
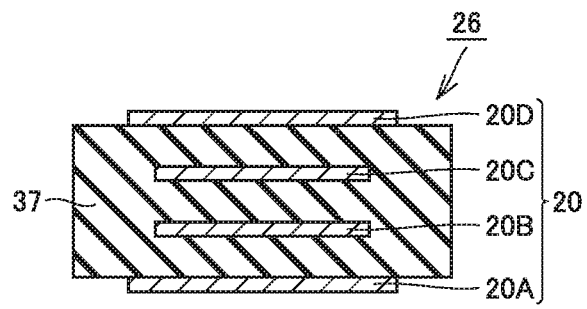
FIG. 3 is a schematic sectional view showing the configuration of the multilayer printed board at a portion taken along the line III-III in FIG. 2, after final assembly.

Referring to FIGS. 2 and 3, multilayer printed board 26 after final assembly is a substrate formed by using a substrate body 37 of an insulating material, such as generally-known resin, for example, as a base and a pattern 20 of a plurality of metallic thin films of copper or the like, for example, formed therein as traces. Multilayer printed board 26 of the present embodiment has a four-layer pattern of patterns 20A, 20B, 20C, and 20D, for example. Among them, pattern 20A of the lowermost layer may be formed so as to come into contact with the lowermost surface of substrate body 37 (i.e., so as to be the lowermost layer of multilayer printed board 26 as a whole). Pattern 20D of the uppermost layer may be formed so as to come into contact with the uppermost surface of substrate body 37 (i.e., so as to be the uppermost layer of multilayer printed board 26 as a whole). However, this mode is not a limitation, but patterns 20A and 20D, for example, may be formed within multilayer printed board 26 (similarly to patterns 20B and 20C). Patterns 20A to 20D are in the mode in which they are spaced from each other in the vertical direction in FIG. 3 by substrate body 37 made of an insulating material and are not electrically connected (not short-circuited) to each other unless they are connected by wiring vias or the like, for example.

Multilayer printed board 26 having four-layer patterns 20A to 20D as shown in FIG. 3 may also be called a four-layer printed circuit board. By arranging four-layer patterns 20A to 20D around through-holes 26A1 to 26A3 and the like, through-holes 26A1 to 26A3 and the like are surrounded by patterns 20A to 20D.

Next, the configuration of the pattern, that is, the input-side and output-side coils, of each layer, and the operation of the step-down transformer in the present embodiment will be described using FIGS. 4 to 5.

Figure 4:
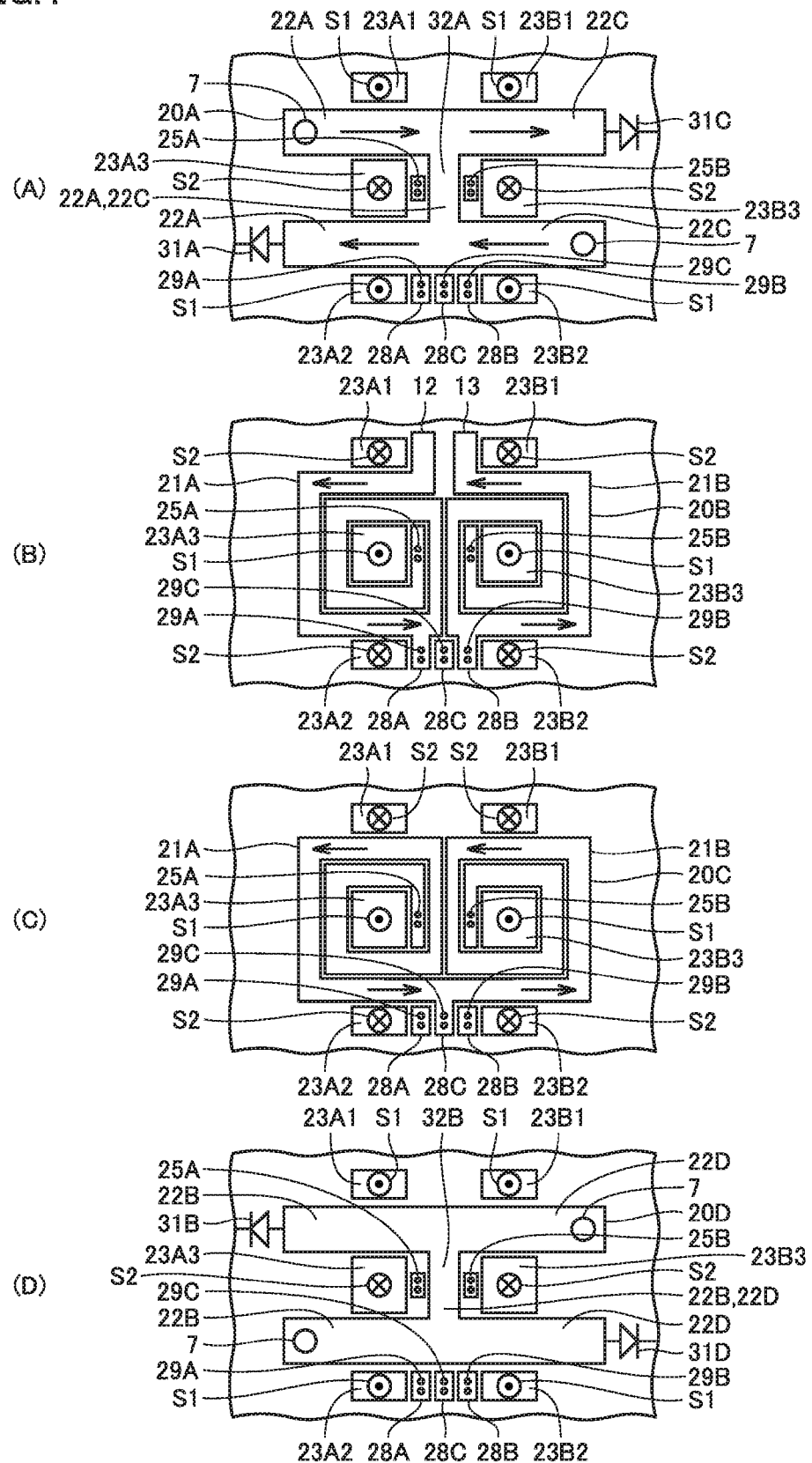

Referring to FIG. 4 (A), in the present embodiment, when the first layer which is the lowermost layer of four-layer patterns 20A to 20D of multilayer printed board 26 is seen in plan view, two output-side coils 22A and 22C are arranged on this plane as the same layer as pattern 20A of FIG. 3. That is, above-described output-side coils 22A and 22C may be considered as the same layer as pattern 20A (a film corresponding to pattern 20A), and are coils formed as a copper thin film pattern, for example.

Output-side coil 22A is arranged to pass through the region extending in the horizontal direction in FIG. 4 (A) between outer leg 23A1 and middle leg 23A3, the region extending in the horizontal direction in FIG. 4 (A) between outer leg 23A2 and middle leg 23A3, and the region extending in the vertical direction in FIG. 4 (A) and connecting these two regions. Output-side coil 22A is thereby in a mode of being spirally wound one turn around middle leg 23A3 (while being bent as if to draw the character of "C" in plan view), for example, as shown in the drawing.

Reference potential 7 is connected to one end of a pair of ends of output-side coil 22A, that is, one end (on the upper left side in FIG. 4 (A)) of the region interposed between outer leg 23A1 and middle leg 23A3. The anode of rectifier element 31A (first rectifier element) is connected in series with the other end of the pair of ends of output-side coil 22A, that is, one end (on the lower left side in FIG. 4 (A)) of the region interposed between outer leg 23A2 and middle leg 23A3.

Also similarly, output-side coil 22C is arranged to pass through the region extending in the horizontal direction in FIG. 4 (A) between outer leg 23B1 and middle leg 23B3, the region extending in the horizontal direction in FIG. 4 (A) between outer leg 23B2 and middle leg 23B3, and the region extending in the vertical direction in FIG. 4 (A) and connecting these two regions. Output-side coil 22C is thereby in a mode of being spirally wound one turn around middle leg 23B3 (while being bent as if to draw the character of "C" in plan view), for example, as shown in the drawing.

Reference potential 7 is connected to one end of a pair of ends of output-side coil 22C, that is, one end (on the lower right side in FIG. 4 (A)) of the region interposed between outer leg 23B2 and middle leg 23B3. The anode of rectifier element 31C (third rectifier element) is connected in series with the other end of the pair of ends of output-side coil 22C, that is, one end (on the upper right side in FIG. 4 (A)) of the region interposed between outer leg 23B1 and middle leg 23B3.

Output-side coil 22C between outer leg 23B1 and middle leg 23B3 and output-side coil 22A between outer leg 23A1 and middle leg 23A3 are configured to be continuous with each other and form a single linear shape extending in the horizontal direction in FIG. 4 (A). Similarly, output-side coil 22C between outer leg 23B2 and middle leg 23B3 and output-side coil 22A between outer leg 23A2 and middle leg 23A3 are configured to be continuous with each other and form a single linear shape extending in the horizontal direction in FIG. 4 (A).

Output-side coils 22A and 22C extending in the vertical direction in FIG. 4 (A) are integrated and shared with each other. This region shared with each other corresponds to a central portion (intermediate portion) in the directions in which output-side coils 22A and 22C extend, respectively. Since the central portions of output-side coils 22A and 22C are in contact with each other, intermediate connection portion 32A in which output-side coils 22A and 22C are electrically short-circuited is formed. Output-side coils 22A and 22C thereby have a shape just like the character of "H" when the whole is seen in plan view. Intermediate connection portion 32A is the same layer as pattern 20A, and is thus the same layer as output-side coils 22A and 22C.

Referring to FIG. 4 (B), when the second lowermost layer of four-layer patterns 20A to 20D of multilayer printed board 26 is seen in plan view, input-side coils 21A and 21B are arranged on this plane as the same layer as pattern 20B of FIG. 3. That is, above-described input-side coils 21A and 21B may be considered as the same layer as pattern 20B (a film corresponding to pattern 20B), and are coils formed as a copper thin film pattern, for example.

Input-side coil 21A is arranged to pass through the region between outer leg 23A1 and middle leg 23A3, the region between outer leg 23A2 and middle leg 23A3, and the region connecting these two regions. In more detail, input-side coil 21A is in a mode of being spirally wound two turns around middle leg 23A3, for example, as shown in the drawing. Spiral input-side coil 21A is configured such that a gap is left between the first turn and the second turn to prevent them from being electrically short-circuited. Input-side coil 21A extends linearly in each of the above-described regions, and is bent approximately perpendicularly at boundaries between the respective regions. Accordingly, input-side coil 21A is wound around middle leg 23A3 so as to present a rectangular shape in plan view.

Similarly, input-side coil 21B is arranged to pass through the region between outer leg 23B1 and middle leg 23B3, the region between outer leg 23B2 and middle leg 23B3, and the region connecting these two regions. In more detail, input-side coil 21B is in a mode of being spirally wound two turns around middle leg 23B3, for example, as shown in the drawing. Spiral input-side coil 21B is configured such that a gap is left between the first turn and the second turn to prevent them from being electrically short-circuited. Input-side coil 21B extends linearly in each of the above-described regions, and is bent approximately perpendicularly at boundaries between the respective regions. Accordingly, input-side coil 21B is wound around middle leg 23B3 so as to present a rectangular shape in plan view.

Accordingly, input-side coil 21A wound around middle leg 23A3 constitutes step-down transformer 2A, and input-side coil 21B wound around middle leg 23B3 constitutes step-down transformer 2B.

Referring to FIG. 4 (C), when the third lowermost layer of four-layer patterns 20A to 20D of multilayer printed board 26 is seen in plan view, input-side coils 21A and 21B are arranged on this plane as the same layer as pattern 20C of FIG. 3. That is, above-described input-side coils 21A and 21B may be considered as the same layer as pattern 20C (a film corresponding to pattern 20C), and are coils formed as a copper thin film pattern, for example.

Input-side coils 21A and 21B shown in FIG. 4 (C) are in a mode of being spirally wound two turns around middle legs 23A3 and 23B3, for example, approximately similarly to input-side coils 21A and 21B shown in FIG. 4 (B). Two turns of input-side coils 21A and 21B shown in FIG. 4 (B) and two turns of input-side coils 21A and 21B shown in FIG. 4 (C) are electrically connected together by connection vias 25A and 25B, and a combination of them functions as one input-side coil 21A and one input-side coil 21B. Ends of input-side coils 21A and 21B of FIG. 4 (B) opposite to the ends connected to connection vias 25A and 25B correspond to nodes 12 and 13 of FIG. 1.

A total of four turns of input-side coil 21A and a total of four turns of input-side coil 21B are thereby formed. In FIG. 4 (C), input-side coils 21A and 21B are connected in series.

Referring to FIG. 4 (D), when the uppermost layer of four-layer patterns 20A to 20D of multilayer printed board 26 is seen in plan view, two output-side coils 22B and 22D are arranged on this plane as the same layer as pattern 20D of FIG. 3. That is, above-described output-side coils 22B and 22D may be considered as the same layer as pattern 20D (a film corresponding to pattern 20D), and are coils formed as a copper thin film pattern, for example.

Output-side coil 22B is arranged to pass through the region extending in the horizontal direction in FIG. 4 (D) between outer leg 23A1 and middle leg 23A3, the region extending in the horizontal direction in FIG. 4 (D) between outer leg 23A2 and middle leg 23A3, and the region extending in the vertical direction in FIG. 4 (D) and connecting these two regions. Output-side coil 22B is thereby in a mode of being spirally wound one turn around middle leg 23A3 (while being bent as if to draw the character of "C" in plan view), for example, as shown in the drawing.

Reference potential 7 is connected to one end of a pair of ends of output-side coil 22B, that is, one end (on the lower left side in FIG. 4 (D)) of the region interposed between outer leg 23A2 and middle leg 23A3. The anode of rectifier element 31B (second rectifier element) is connected in series with the other end of the pair of ends of output-side coil 22B, that is, one end (on the upper left side in FIG. 4 (D)) of the region interposed between outer leg 23A1 and middle leg 23A3.

Also similarly, output-side coil 22D is arranged to pass through the region extending in the horizontal direction in FIG. 4 (D) between outer leg 23B1 and middle leg 23B3, the region extending in the horizontal direction in FIG. 4 (D) between outer leg 23B2 and middle leg 23B3, and the region extending in the vertical direction in FIG. 4 (D) and connecting these two regions. Output-side coil 22D is thereby in a mode of being spirally wound one turn around middle leg 23B3 (while being bent as if to draw the character of "C" in plan view), for example, as shown in the drawing.

Reference potential 7 is connected to one end of a pair of ends of output-side coil 22D, that is, one end (on the upper right side in FIG. 4 (D)) of the region interposed between outer leg 23B1 and middle leg 23B3. The anode of rectifier element 31D (fourth rectifier element) is connected in series with the other end of the pair of ends of output-side coil 22D, that is, one end (on the lower right side in FIG. 4 (D)) of the region interposed between outer leg 23B2 and middle leg 23B3.

Output-side coil 22D between outer leg 23B1 and middle leg 23B3 and output-side coil 22B between outer leg 23A1 and middle leg 23A3 are configured to be continuous with each other and form a single linear shape extending in the horizontal direction in FIG. 4 (D). Similarly, output-side coil 22D between outer leg 23B2 and middle leg 23B3 and output-side coil 22B between outer leg 23A2 and middle leg 23A3 are configured to be continuous with each other and form a single linear shape extending in the horizontal direction in FIG. 4 (D).

Output-side coil 22D between outer leg 23B1 and middle leg 23B3 and output-side coil 22B between outer leg 23A1 and middle leg 23A3 are configured to be continuous with each other and form a single linear shape extending in the horizontal direction in FIG. 4 (D). Similarly, output-side coil 22D between outer leg 23B2 and middle leg 23B3 and output-side coil 22B between outer leg 23A2 and middle leg 23A3 are configured to be continuous with each other and form a single linear shape extending in the horizontal direction in FIG. 4 (D).

Output-side coils 22B and 22D extending in the vertical direction in FIG. 4 (D) are integrated and shared with each other. This region shared with each other corresponds to a central portion (intermediate portion) in the directions in which output-side coils 22B and 22D extend, respectively. Since the central portions of output-side coils 22B and 22D are in contact with each other, intermediate connection portion 32B in which output-side coils 22B and 22D are electrically short-circuited is formed. Output-side coils 22B and 22D thereby have a shape just like the character of "H" when the whole is seen in plan view. Intermediate connection portion 32B is the same layer as pattern 20D, and is thus the same layer as output-side coils 22B and 22D.

As described above, in multilayer printed board 26, the input-side and output-side coils are formed to be stacked on one another with spacing between them in the thickness direction. Middle legs 23A3 and 23B3 of E-shaped cores 23A and 23B extend through multilayer printed board 26 so as to be surrounded by these input-side and output-side coils.

The portions of above-described output-side coils 22A to 22D (interposed between the outer and middle legs) extending linearly in plan view overlap one of input-side coils 21A and 21B immediately thereabove (immediately therebelow) at least partly. Therefore, output-side coils 22A to 22D arranged as merely one turn are larger in width than input-side coils 21A and 21B having a narrow width so as to enable spiral two-turn winding in the regions between outer legs 23A1, 23A2 and middle leg 23A3.

Since a voltage is applied to input-side coil 21 in opposite directions to each other in the first state and the second state as described above, electric current flows in this input-side coil 21 in opposite directions to each other in the first state and the second state. Next, changes in the flow of electric current in output-side coil 22 caused by this will be described.

Here, as shown in FIG. 4 (B) and FIG. 4 (C), for example, the first state in which switching elements 11A and 11D (see FIG. 1) are turned on, so that a positive input voltage of DC power supply 6 is applied to input-side coil 21, causing electric current to flow from node 12 toward node 13 of switching element 11 in a direction of arrows in the drawings is discussed. At this time, electric current flows from the outside toward the inside of the spiral of input-side coil 21A (from the inside toward the outside of the spiral of input-side coil 21B) in FIG. 4 (B), and flows from the inside toward the outside of the spiral of input-side coil 21A (from the outside toward the inside of the spiral of input-side coil 21B) in FIG. 4 (C).

With this electric current, a magnetic flux S1 upward perpendicularly to the plane of drawing occurs in middle legs 23A3 and 23B3 wound around input-side coils 21A and 21B, and a magnetic flux is created in a loop in accordance with two magnetic paths formed between outer legs 23A1, 23A2, 23B1, 23B2 and middle legs 23A3, 23B3, respectively. Therefore, a magnetic flux S2 occurs in outer legs 23A1, 23A2, 23B1, and 23B2 downward perpendicularly to the plane of drawing in the opposite direction to middle legs 23A3 and 23B3.

Referring again to FIGS. 4 (A) and (D), an induced electromotive force occurs in output-side coils 22A and 22C so as to cancel out magnetic flux S1 in middle legs 23A3 and 23B3 in FIGS. 4 (B) and (C) described above, that is, such that magnetic flux S2 occurs in middle legs 23A3 and 23B3, and electric current is going to flow. It is noted that, at this time, magnetic flux S1 is going to occur in outer legs 23A1, 23A2, 23B1, and 23B2. Based on a similar theory to output-side coils 22A and 22C, electric current is also going to flow in output-side coils 22B and 22D. It is noted that the directions of magnetic fluxes which are going to occur resulting from the situations shown in FIGS. 4 (B) and (C) are indicated in cores 23A1 to 23A3 and 23B1 to 23B3 shown in FIGS. 4 (A) and (D).

For that purpose, electric current is going to flow clockwise in the plane of the drawing in output-side coils 22A, 22B, 22C, and 22D. However, the electric current which is going to flow in output-side coils 22B and 22D is interrupted by the rectifying function of rectifier elements 31B and 31D and does not flow. Actually, the electric current indicated by the arrows in FIG. 4 (A) flows only in output-side coils 22A and 22C so as to pass through rectifier elements 31A and 31C. Specifically, since output-side coils 22A and 22C are magnetically coupled by E-shaped cores 23A, 23B and I-shaped cores 24A, 24B, electric current flows in output-side coils 22A and 22C in the opposite direction to the electric current flowing in input-side coils 21A and 21B overlapping them in plan view.

At this time, the electric current flowing in output-side coil 22A and the electric current flowing in output-side coil 22C are almost equal in value. Accordingly, in output-side coils 22A and 22C extending in the vertical direction in FIG. 4 (A) (intermediate connection portion 32A), the electric current flowing downward in the drawing in output-side coil 22A and the electric current flowing upward in the drawing in output-side coil 22C cancel each other out, resulting in no flow of electric current in appearance.

Figure 5:
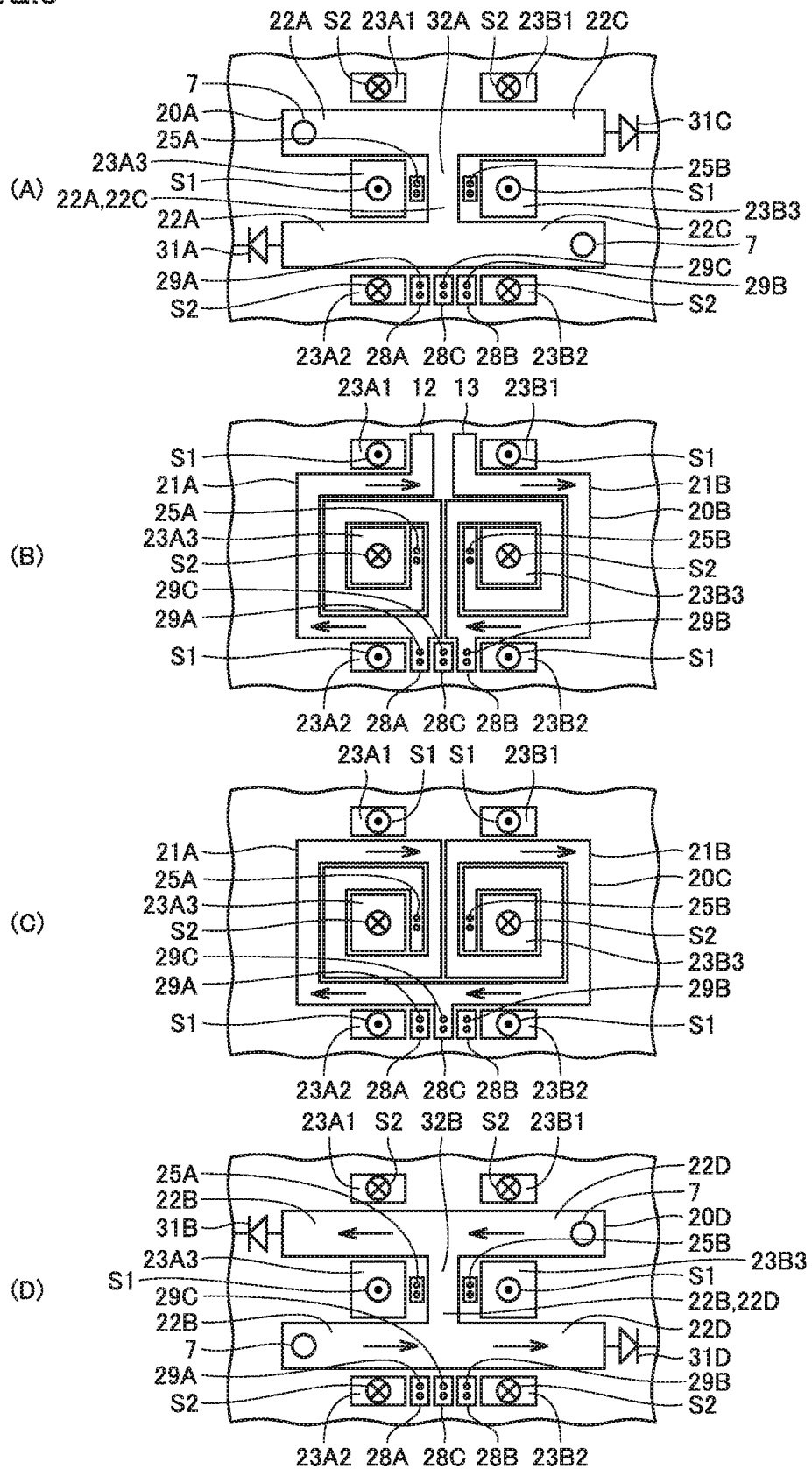

Next, as indicated by the arrows in FIG. 5 (B) and FIG. 5 (C), the second state in which switching elements 11B and 11C (see FIG. 1) are turned on, so that a positive input voltage of DC power supply 6 is applied to input-side coil 21, causing electric current to flow from node 13 toward node 12 of switching element 11 is discussed. At this time, electric current flows from the inside toward the outside of the spiral of input-side coil 21A (from the outside toward the inside of the spiral of input-side coil 21B) in FIG. 5 (B), and flows from the outside toward the inside of the spiral of input-side coil 21A (from the inside toward the outside of the spiral of input-side coil 21B) in FIG. 5 (C).

With these electric currents, contrary to the above case, magnetic flux S2 occurs in middle legs 23A3 and 23B3 wound around input-side coil 21A, and magnetic flux S1 occurs in outer legs 23A1, 23A2, 23B1, and 23B2.

Referring to FIGS. 5 (A) and (D), an induced electromotive force occurs in output-side coils 22A and 22C so as to cancel out magnetic flux S2 created by changes in magnetic flux occurred in middle legs 23A3 and 23B3 in above-described FIGS. 5 (B) and (C), that is, such that magnetic flux S1 occurs in middle legs 23A3 and 23B3, and electric current is going to flow. It is noted that, at this time, magnetic flux S2 is going to occur in outer legs 23A1, 23A2, 23B1, and 23B2. The same applies to output-side coils 22B and 22D. The directions of magnetic fluxes which are going to occur are indicated in cores 23A1 to 23A3 and 23B1 to 23B3 in FIGS. 5 (A) and (D).

For that purpose, electric current is going to flow counterclockwise in the plane of the drawing in output-side coils 22A, 22B, 22C, and 22D. However, the electric current which is going to flow in output-side coils 22A and 22C is interrupted by the rectifying function of rectifier elements 31A and 31C, and does not flow. Actually, the electric current indicated by the arrows in FIG. 5 (D) flows only in output-side coils 22B and 22D so as to pass through rectifier elements 31B and 31D. Specifically, since output-side coils 22B and 22D are magnetically coupled by E-shaped cores 23A, 23B and I-shaped cores 24A, 24B, similarly to the above case, electric current flows in output-side coils 22B and 22D in the opposite direction to the electric current flowing in input-side coils 21A and 21B overlapping them in plan view.

Also at this time, similarly to the above case, in output-side coils 22B and 22D extending in the vertical direction in FIG. 5 (D) (intermediate connection portion 32B), the electric current flowing upward in the drawing in output-side coil 22B and the electric current flowing downward in the drawing in output-side coil 22D cancel each other out, resulting in no flow of electric current in appearance.

As described above, the types of output-side coils in which electric currents flow simultaneously are changed alternately between the first state and the second state. That is, electric currents flow simultaneously in output-side coils 22A and 22C in the first state, and simultaneously in output-side coils 22B and 22D in the second state, in an alternate manner. In addition, the electric current flowing in output-side coil 22A and the electric current flowing in output-side coil 22B immediately thereabove are in opposite directions. The electric current flowing in output-side coil 22C and the electric current flowing in output-side coil 22D immediately thereabove are similarly in opposite directions.

The radiation path of the above-described step-down transformer will now be described using FIG. 6.

Figure 6:
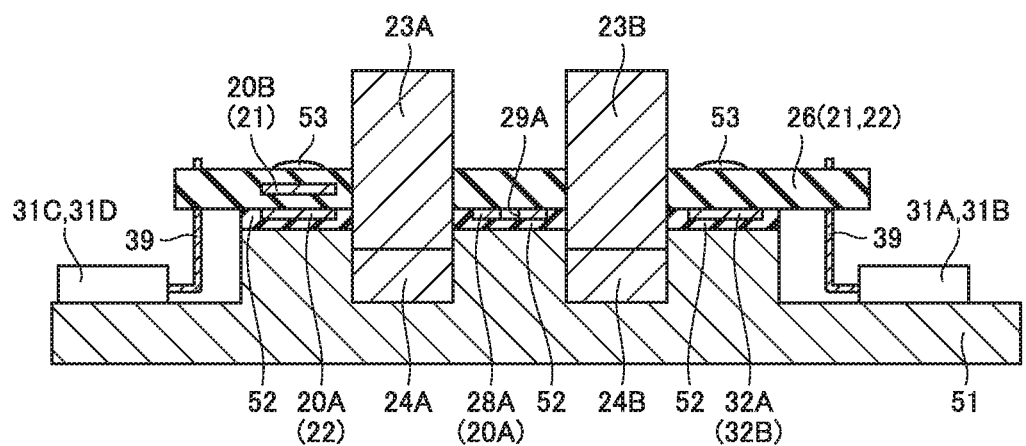
FIG. 6 is a schematic projection view seen from a direction VI indicated by the arrow in FIG. 2, upon assembly of the portion shown in FIG. 2 in the first embodiment.

Referring to FIG. 6, in a projection view seen from a direction VI indicated by the arrow in FIG. 2, the step-down transformer after assembly mainly has a radiator 51, I-shaped cores 24A and 24B mounted on the upper surface of radiator 51, for example, so as to come into contact with the upper surface, E-shaped cores 23A and 23B mounted on the surfaces of I-shaped cores 24A and 24B (so as to come into contact with the surface of radiator 51), and multilayer printed board 26 on the surface of radiator 51.

Although not clearly shown in the drawing, one end of a pair of ends of each of output-side coils 22 formed in multilayer printed board 26 in the above-described mode is (electrically) connected to a corresponding one of rectifier elements 31 (31A to 31D) mounted on the surface of radiator 51 with a wire 39. On the other hand, the other end opposite to the above-described one end of the pair of ends of each of output-side coils 22 leads to radiator 51, for example.

Accordingly, each of step-down transformers 2A and 2B is mounted so as to come into contact with radiator 51 on its lower side. To put it conversely, radiator 51 is arranged so as to come into contact with at least a portion of the surface of each of step-down transformers 2A and 2B.

Specifically, multilayer printed board 26 is mounted so as to at least partly come into contact with radiator 51 with an insulating sheet 52 (insulating component) interposed therebetween. More specifically, insulating sheet 52 is arranged between radiator 51 and at least one of input-side coils 21 (21A and 21B) and at least one of first to fourth output-side coils 22 (22A to 22D) of multilayer printed board 26. Particularly in this case, insulating sheet 52 is arranged between radiator 51 and pattern 20A (output-side coils 22A and 22C, for example) of the lowermost layer of multilayer printed board 26, and pattern 20A and insulating sheet 52 are in direct contact with each other. It is noted that the projection shape of radiator 51 is merely an example, and is not limited to this.

Accordingly, heat generated by driving at least one of input-side coils 21A and 21B and at least one of output-side coils 22A to 22D is transferred to radiator 51 through insulating sheet 52 which is in direct contact with output-side coils 22A and 22C, for example. Output-side coil 22 (and input-side coil 21) of multilayer printed board 26 are thereby cooled. Radiator 51 can be air-cooled or water-cooled to radiate heat.

As shown in particularly the region on the left side of E-shaped core 23 in FIG. 6, pattern 20A (output-side coil 22: at least one of output-side coils 22A to 22D) is arranged between radiator 51 and pattern 20B (input-side coil 21: at least one of input-side coils 21A and 21B). In this region (ends of input-side coil 21 and output-side coil 22 on both the right and left sides in plan view), one end of output-side coil 22 is electrically and thermally connected to radiator 51 with screws 53.

With these screws 53, multilayer printed board 26 can be stably fixed to radiator 51, and electricity and heat can be easily transferred from output-side coil 22 to radiator 51 through screws 53. At this time, radiator 51 is arranged as reference potential 7 (see FIGS. 1, 4 and 5) of the output-side circuit including output-side coil 22 (at least one of output-side coils 22A to 22D) of step-down transformers 2A and 2B. With screws 53, output-side coil 22 and radiator 51 can also be electrically connected through the contact surface between pattern 20 of multilayer printed board 26 and radiator 51.

In this way, there are two paths to transfer the heat generated by output-side coil 22 to radiator 51: one through insulating sheet 52; and the other through screws 53.

In addition, as shown in FIG. 6, (at least) one of intermediate connection portion 32A of output-side coils 22A and 22C and intermediate connection portion 32B of output-side coils 22B and 22D may be in a mode of being in contact with radiator 51 through insulating sheet 52. It is noted that although intermediate connection portions 32A and 32B should normally be arranged between E-shaped cores 23A and 23B in FIG. 6 in view of the conformity with FIGS. 4 and 5, intermediate connection portions 32A and 32B are indicated on the right side of E-shaped core 23B for space reasons.

Thus, intermediate connection portions 32A and 32B can be thermally coupled to radiator 51 having high thermal conductivity and high thermal capacity, so that good thermal balance can be easily attained between output-side coils 22A and 22C. Accordingly, the temperatures of output-side coils 22 constituting two step-down transformers 2A and 2B, respectively, can be easily controlled to be equal.

Next, as to heat generated by input-side coil 21 within multilayer printed board 26, there is a path to transfer the heat first to output-side coil 22 through substrate body 37 of multilayer printed board 26, and then to radiator 51 (through insulating sheet 52). There is also a path to transfer the heat from connection vias 25 (see FIGS. 4 (B) and (C)) to radiator 51 through insulating sheet 52. There is also a path to transfer the heat to radiation patterns 28A, 28B, and 28C (see FIG. 4 (A) to (D)) by radiation vias 29A, 29B, and 29C which have been copper plated on their wall surfaces, and transfer the heat from radiation patterns 28A, 28B, and 28C of the lowermost layer of multilayer printed board 26 (see FIG. 4 (A)) to radiator 51 through insulating sheet 52.

In this way, there are three paths to transfer the heat generated by input-side coil 21 to radiator 51: one through substrate body 37; one through connection vias 25; and one through radiation patterns 28A to 28C.

By having the plurality of heat transfer paths as described above, the heat generated by input-side coil 21 and output-side coil 22 can be transferred to radiator 51 with high efficiency.

It is noted that in multilayer printed board 26, input-side coil 21 and output-side coil 22 need to be insulated such that a relatively strict standard is met. However, insulating sheet 52 interposed between output-side coil 22 corresponding to pattern 20A of the lowermost layer of multilayer printed board 26 and radiator 51 which is reference potential 7 on the output side does not need to meet a very strict insulating standard, as compared to an example where insulating sheet 52 is interposed between input-side coil 21 and radiator 51. Insulating sheet 52 interposed between output-side coil 22 and radiator 51 can thus be reduced in thickness. Thus, heat generated by input-side coil 21 and output-side coil 22 can be transferred to radiator 51 more easily because of the interposition of insulating sheet 52.

Next, operation effects of the present embodiment will be described, while changes in voltage applied to each coil and in electric current flowing in each smoothing coil between the above-described respective states are described using FIG. 7.

Figure 7:
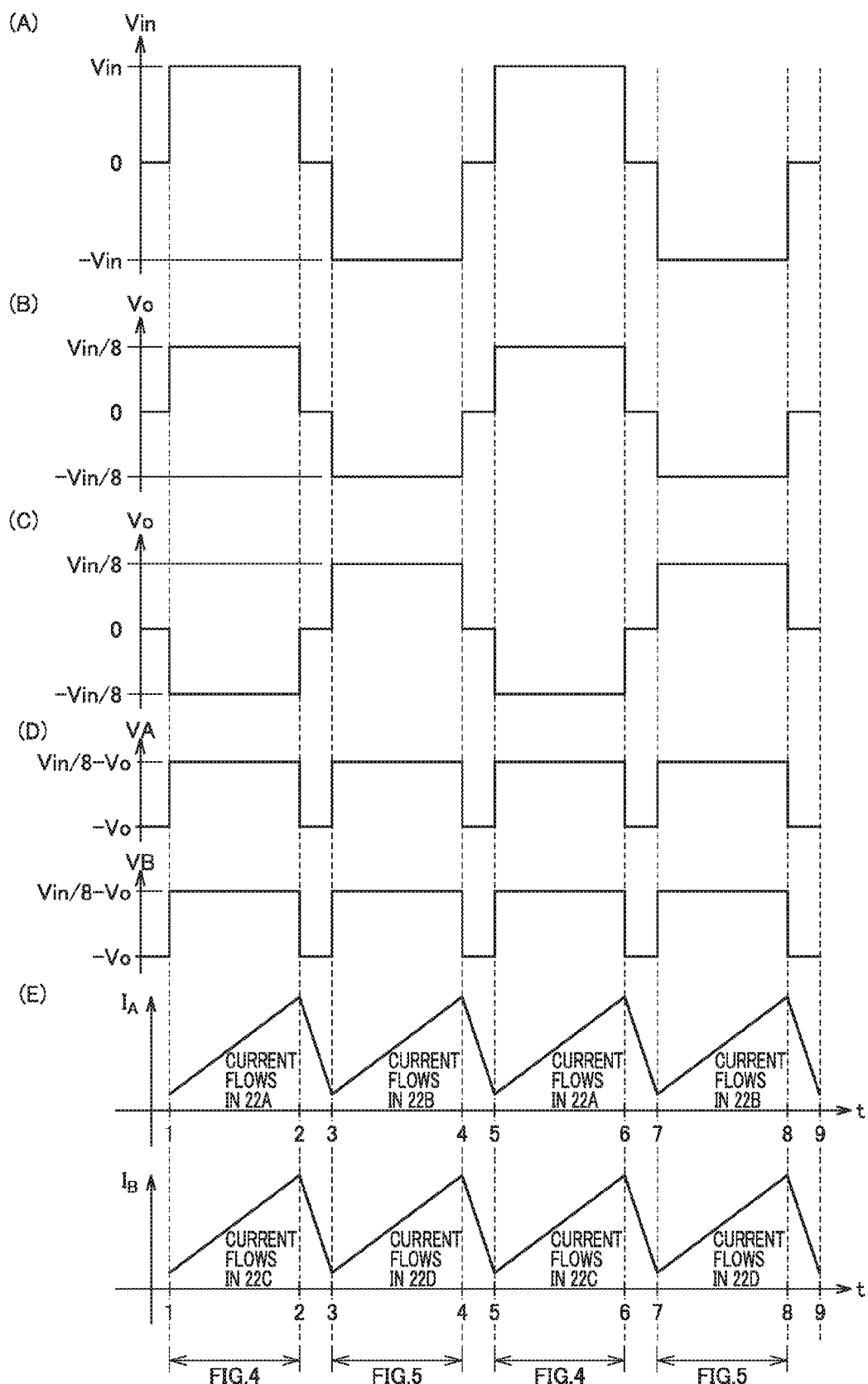
FIG. 7 shows a graph (A) showing time changes in voltage applied to input-side coils, a graph (B) showing time changes in voltage applied to output-side coils 22A and 22C, a graph (C) showing time changes in voltage applied to output-side coils 22B and 22D, a graph (D) showing time changes in voltage applied to smoothing coils, and a graph (E) showing time changes in electric current flowing in the smoothing coils.

Referring to FIG. 7 (A), the vertical axis of this graph indicates a total value of voltages applied to input-side coils 21A and 21B. First, when in the first state shown in FIG. 4, a positive voltage Vin is applied in total to input-side coils 21A and 21B by input-side drive circuit 1. Thus, a voltage of Vin/2 is applied to each of input-side coils 21A and 21B.

Referring to FIG. 7 (B), the vertical axis of this graph indicates a voltage applied to each of output-side coils 22A and 22C. As shown in FIG. 7 (B), when in the first state shown in FIG. 4, a positive voltage is applied to each of output-side coils 22A and 22C in which electric current flows. Here, depending on the ratio of the number of turns of the input-side coil to that of the output-side coil in step-down transformers 2A and 2B (four to one in the present embodiment), the voltage in the output-side coil is lower than the voltage in the input-side coil, and a voltage of Vin/8 is applied to each of output-side coils 22A and 22C.

Referring to FIG. 7 (C), the vertical axis of this graph indicates a voltage applied to each of output-side coils 22B and 22D. As shown in FIG. 7 (C), in the first state shown in FIG. 4, a negative voltage, specifically, −Vin/8, is applied to each of output-side coils 22B and 22D in which electric current does not flow, but the electric current is interrupted by rectifier elements 31B and 31D as described above.

Next, referring again to FIG. 7 (A), in the second state shown in FIG. 5, a negative voltage −Vin reversed in phase relative to the first state is applied in total to input-side coils 21A and 21B.

Referring to FIGS. 7 (B) and (C), when in the second state, a positive voltage Vin/8 is applied to output-side coils 22B and 22D in which electric current flows, and a negative voltage −Vin/8 is applied to each of output-side coils 22A and 22C in which electric current does not flow.

Both in the above-described first and second states, a mode is brought about in which a voltage produced in the output-side coil (output from the output-side coil) is similar to the DC voltage applied only in one direction by rectification of electric current in rectifier elements 31A to 31D, and is further smoothed in smoothing capacitors 41 and 42). Smoothed DC voltage Vo is thereby applied to the both ends of smoothing capacitor 41.

Referring again to FIG. 1, output-side coils 22A and 22B are connected to (first) smoothing coil 42A, and output-side coils 22C and 22D are connected to (second) smoothing coil 42B. Accordingly, electric currents flowing in output-side coils 22A and 22B flow to smoothing coil 42A, and electric currents flowing in output-side coils 22C and 22D flow to smoothing coil 42B.

Referring now to FIG. 7 (D), the upper graph of two vertically aligned graphs shows time changes in voltage applied to smoothing coil 42A, and the lower graph shows time changes in voltage applied to smoothing coil 42B. The horizontal axis of these graphs indicates, in conformity with the horizontal axis of FIG. 7 (A) to (C), time change in the first state shown in FIG. 4 and the second state shown in FIG. 5, and the vertical axis indicates a voltage value $V_A$ of smoothing coil 42A or a voltage value $V_B$ of smoothing coil 42B.

Referring to FIG. 7 (E), the upper graph of two vertically aligned graphs shows an electric current value $I_A$ of smoothing coil 42A, and the lower graph shows an electric current value $I_B$ of smoothing coil 42B. It is noted that elapsed times 1 to 9 along the horizontal axis, which are common to all graphs of FIG. 7 (A) to (E), each indicate, as a relative value of a dimensionless number, the time at which electric current value $I_A$ or $I_B$ indicates the local maximum or the local minimum.

Referring to FIGS. 7 (D) and (E), when in the first state of FIG. 4, electric current flowing in output-side coil 22A flows to smoothing coil 42A by rectifier element 31A. At this time, a voltage of Vin/8−Vo is applied to smoothing coil 42A. This is a value obtained by subtracting the voltage in smoothing capacitor 41 from the high-voltage-side voltage in output-side coil 22A. Similarly, electric current flowing in output-side coil 22C flows to smoothing coil 42B by rectifier element 31C, and the voltage of Vin/8−Vo is also applied to smoothing coil 42B at this time.

When in the second state of FIG. 5, electric current flowing in output-side coil 22B flows to smoothing coil 42A by rectifier element 31B, and electric current flowing in output-side coil 22D flows to smoothing coil 42B by rectifier element 31D. Similarly to the above case, the voltage of Vin/8−Vo is applied to smoothing coils 42A and 42B at this time.

If neither of the first and second states applies and no electric current flows in smoothing coils 42A and 42B, a reverse voltage −Vo of smoothing coil 41 is applied to smoothing coils 42A and 42B. In each of the states between times t=1 and t=2 (first state), between times t=2 and t=3, and between times t=3 and t=4 (second state) in FIG. 7 (E), the gradient of each of the electric currents flowing in smoothing coils 42A and 42B corresponds to a value obtained by dividing the value of an applied voltage by the value of an inductance of the coil.

In FIG. 7 (A), the voltages applied to input-side coils 21A and 21B are almost equal in value, which is ±Vin/2, between two step-down transformers 2A and 2B. In FIGS. 7 (B) and (C), the voltage in two output-side coils 22A and 22B of step-down transformer 2A when electric currents flow therein, and the voltage in two output-side coils 22C and 22D of step-down transformer 2B when electric currents flow therein are almost equal, which is Vin/8. Accordingly, as shown in FIGS. 7 (D) and (E), the voltages applied to and electric currents flowing in smoothing coils 42A and 42B are equal in value. This is a state in which coupling balance is achieved between step-down transformers 2A and 2B because of the coupling balance between the input-side coil and output-side coil, for example.

However, it is believed that, due to various factors responsible for unbalance, for example, the voltages in two output-side coils 22A and 22B of step-down transformer 2A may become higher in value, for example, than the voltages in two output-side coils 22C and 22D of step-down transformer 2B.

In the present embodiment, however, the intermediate portion of output-side coil 22A and the intermediate portion of output-side coil 22C are electrically connected and short-circuited.

Accordingly, in the first state, the voltage in output-side coil 22A generated in the region between outer leg 23A1 and middle leg 23A3 and the voltage in output-side coil 22A generated in the region between outer leg 23A2 and middle leg 23A3 are almost equal in value. Also in the first state, the voltage in output-side coil 22C generated in the region between outer leg 23B1 and middle leg 23B3 and the voltage in output-side coil 22C generated in the region between outer leg 23B2 and middle leg 23B3 are almost equal in value. As a result, in the first state, the voltages in the intermediate portion of output-side coil 22A and the intermediate portion of output-side coil 22C are almost equal in value, which is Vin/16.

Also in the present embodiment, the intermediate portion of output-side coil 22B and the intermediate portion of output-side coil 22D are electrically connected and short-circuited.

Accordingly, in the second state, the voltage in output-side coil 22B generated in the region between outer leg 23A1 and middle leg 23A3 and the voltage in output-side coil 22B generated in the region between outer leg 23A2 and middle leg 23A3 are almost equal in value. Also in the second state, the voltage in output-side coil 22D generated in the region between outer leg 23B1 and middle leg 23B3 and the voltage in output-side coil 22D generated in the region between outer leg 23B2 and middle leg 23B3 are almost equal in value. As a result, in the second state, the voltages in the intermediate portion of output-side coil 22B and the intermediate portion of output-side coil 22D are almost equal in value, which is Vin/16.

That is, in each of output-side coils 22A to 22D, the value of the voltage when electric current flows therein is equal to Vin/8. Since the values of the voltages applied to the output-side coils are equal in this manner, the voltages applied to and electric currents flowing in smoothing coils 42A and 42B are equal in value.

As described above, in the present embodiment, the configuration is such that the intermediate portion of output-side coil 22A and the intermediate portion of output-side coil 22C are electrically connected, and the intermediate portion of output-side coil 22B and the intermediate portion of output-side coil 22D are electrically connected. Accordingly, even if coupling unbalance occurs between the values of voltages applied to input-side coils 21A and 21B and the values of voltages applied to the two output-side coils included in one step-down transformer, the sum of current values of the output-side coils included in respective step-down transformers 2A and 2B can be made equal at all times. Accordingly, the current values of two smoothing coils 42A and 42B can be made equal. Thus, it is not required to leave a margin of smoothing coils 42A and 42B due to electric current unbalance between two smoothing coils 42A and 42B, thereby reducing smoothing coils 42A and 42B in size.

In addition, output-side coils 22A and 22C are also thermally coupled at intermediate connection portion 32A, and output-side coils 22B and 22D are also thermally coupled at intermediate connection portion 32B. That is, output-side coils 22A and 22C become equal in temperature at intermediate connection portion 32A. Accordingly, thermal unbalance between two step-down transformers 2A and 2B can be suppressed. That is, it is not required to leave a margin in consideration of thermal unbalance for the output-side coils of the two step-down transformers, thereby reducing step-down transformers 2A and 2B in size.

Second Embodiment

A second embodiment differs from the first embodiment in the following respects, but is otherwise basically similar to the first embodiment, and can be described with reference to the circuit block diagram of insulation type step-down converter 101 shown in FIG. 1. First, an overall structure of step-down transformer 2 of the present embodiment will be briefly described using FIG. 8.

Figure 8:
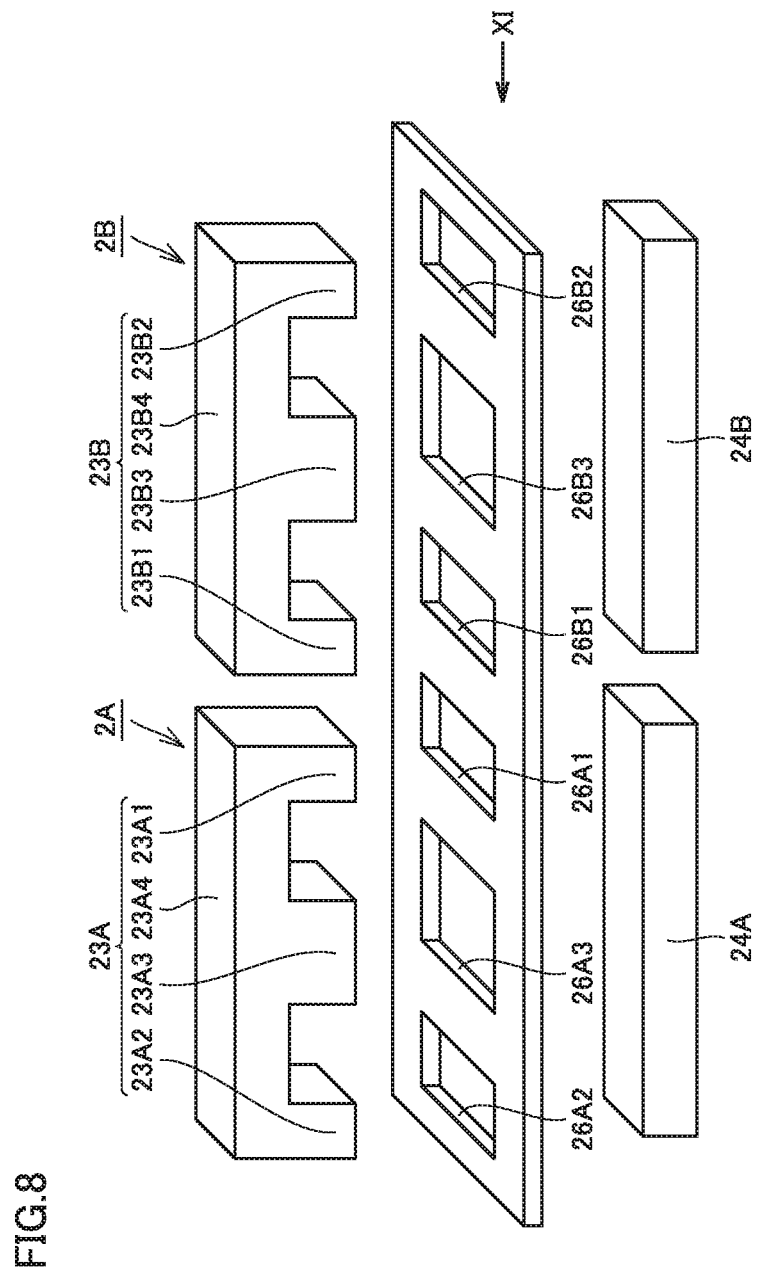
FIG. 8 is an exploded perspective view showing arrangement of cores and a multilayer printed board constituting a step-down transformer of a second embodiment.

Referring to FIG. 8, in the present embodiment, two step-down transformers 2A and 2B are arranged to be aligned in series in the horizontal direction in the drawing. That is, core coupling part 23A4 of step-down transformer 2A and core coupling part 23B4 of step-down transformer 2B are arranged here to be aligned linearly. Accordingly, outer legs 23A1, 23A2, middle leg 23A3 of step-down transformer 2A and outer legs 23B1, 23B2, middle leg 23B3 of step-down transformer 2B are all arranged to be aligned linearly in the horizontal direction in the drawing. As a result, multilayer printed board 26 through which step-down transformers 2A and 2B extend has a longer plane shape than multilayer printed board 26 shown in FIG. 2, such that six through-holes 26A1, 26A2, 26A3, 26B1, 26B2, and 26B3 are aligned linearly.

In FIG. 8, E-shaped core 23A has outer leg 23A2, middle leg 23A3 and outer leg 23A1 aligned in this order from the left side to the right side in the drawing, and E-shaped core 23B has outer leg 23B1, middle leg 23B3 and outer leg 23B2 aligned in this order from the left side to the right side in the drawing. Accordingly, outer legs 23A1 and 23B1 are arranged to face each other in the horizontal direction in FIG. 2. However, this mode is not a limitation, but outer legs 23A1 and 23B2, for example, may be arranged to face each other.

In contrast, in FIG. 2 (first embodiment), two step-down transformers 2A and 2B are arranged to be aligned in parallel in the depth direction in the drawing (core coupling part 23A4 of step-down transformer 2A and core coupling part 23B4 of step-down transformer 2B are aligned in parallel). Accordingly, outer legs 23A1, 23A2, middle leg 23A3 of step-down transformer 2A and outer legs 23B1, 23B2, middle leg 23B3 of step-down transformer 2B are arranged to be aligned in two rows, and multilayer printed board 26 has a rectangular shape which is more square than that of FIG. 8.

Although the present embodiment differs from the first embodiment in this respect, the configuration of each of step-down transformers 2A and 2B and the arrangement of patterns 20A to 20D of the respective layers (four layers, for example) of multilayer printed board 26 are basically similar to those of the first embodiment shown in FIGS. 2 and 3, and thus the description thereof will not be repeated here.

Next, the configuration of the pattern, that is, the input-side and output-side coils, of each layer, and the operation of the step-down transformer in the present embodiment will be described using FIGS. 9 to 10.

Figure 9:
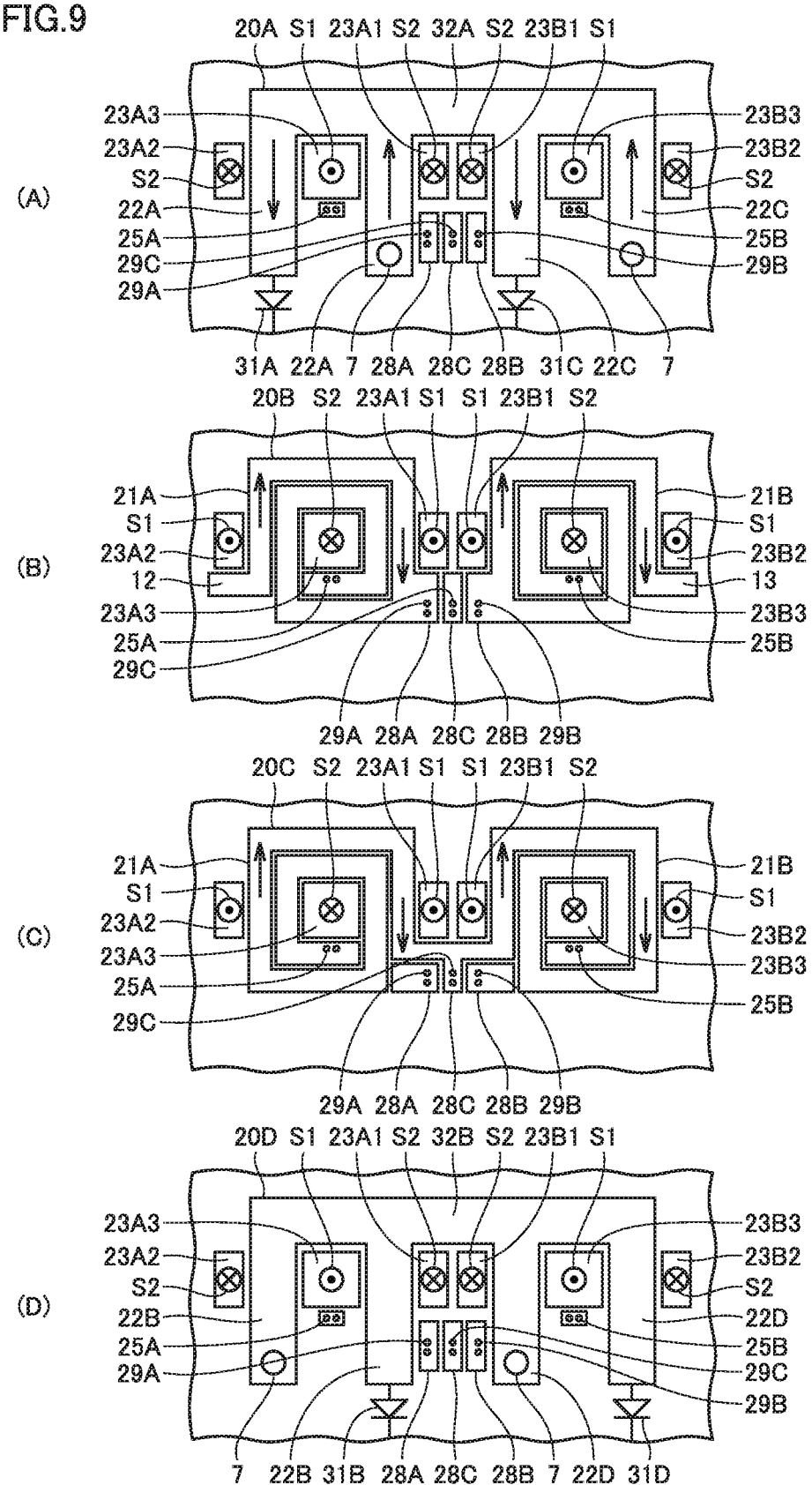

Referring to FIG. 9 (A), also in the present embodiment, when the first layer which is the lowermost layer of four-layer patterns 20A to 20D of multilayer printed board 26 is seen in plan view, two output-side coils 22A and 22C are arranged on this plane as the same layer as pattern 20A of FIG. 3.

Output-side coil 22A is arranged to pass through the region extending in the vertical direction in FIG. 9 (A) between outer leg 23A1 and middle leg 23A3, the region extending in the vertical direction in FIG. 9 (A) between outer leg 23A2 and middle leg 23A3, and the region extending in the horizontal direction in FIG. 9 (A) and connecting these two regions. Output-side coil 22A is thereby in a mode of being spirally wound one turn around middle leg 23A3 (while being bent as if to draw the character of "C" in plan view), for example, as shown in the drawing.

Reference potential 7 is connected to one end of a pair of ends of output-side coil 22A, that is, one end (on the lower right side in FIG. 9 (A)) of the region interposed between outer leg 23A1 and middle leg 23A3. The anode of rectifier element 31A (first rectifier element) is connected in series with the other end of the pair of ends of output-side coil 22A, that is, one end (on the lower left side in FIG. 9 (A)) of the region interposed between outer leg 23A2 and middle leg 23A3.

Also similarly, output-side coil 22C is arranged to pass through the region extending in the vertical direction in FIG. 9 (A) between outer leg 23B1 and middle leg 23B3, the region extending in the vertical direction in FIG. 9 (A) between outer leg 23B2 and middle leg 23B3, and the region extending in the horizontal direction in FIG. 9 (A) and connecting these two regions. Output-side coil 22C is thereby in a mode of being spirally wound one turn around middle leg 23B3 (while being bent as if to draw the character of "C" in plan view), for example, as shown in the drawing.

Reference potential 7 is connected to one end of a pair of ends of output-side coil 22C, that is, one end (on the lower right side in FIG. 9 (A)) of the region interposed between outer leg 23B2 and middle leg 23B3. The anode of rectifier element 31C (third rectifier element) is connected in series with the other end of the pair of ends of output-side coil 22C, that is, one end (on the lower left side in FIG. 9 (A)) of the region interposed between outer leg 23B1 and middle leg 23B3.

Intermediate connection portion 32A extending in the horizontal direction in FIG. 9 (A) is arranged between output-side coil 22A extending in the horizontal direction in FIG. 9 (A) and output-side coil 22C extending in the horizontal direction in FIG. 9 (A). This intermediate connection portion 32A and output-side coils 22A, 22C extending in the horizontal direction in FIG. 9 (A) are configured to be continuous with each other and form a single linear shape. Intermediate connection portion 32A is a wiring region in which the intermediate portion of output-side coil 22A and the intermediate portion of output-side coil 22C are electrically short-circuited.

Referring to FIG. 9 (B), when the second lowermost layer of four-layer patterns 20A to 20D of multilayer printed board 26 is seen in plan view, input-side coils 21A and 21B are arranged on this plane as the same layer as pattern 20B of FIG. 3. Input-side coils 21A and 21B are in a mode of being spirally wound two turns around middle legs 23A3 and 23B3, respectively, basically similarly to FIG. 4 (B) of the first embodiment.

It is noted that nodes 12 and 13 exist on the side on which outer legs 23A1 and 23B1 are arranged in FIG. 4 (B), whereas nodes 12 and 13 exist on the side on which outer legs 23A2 and 23B2 are arranged in FIG. 9 (B). However, this mode is not a limitation.

Referring to FIG. 9 (C), when the third lowermost layer of four-layer patterns 20A to 20D of multilayer printed board 26 is seen in plan view, input-side coils 21A and 21B are arranged on this plane as the same layer as pattern 20C of FIG. 3. Input-side coils 21A and 21B are in a mode of being spirally wound two turns around middle legs 23A3 and 23B3, respectively, basically similarly to FIG. 4 (C) of the first embodiment.

A total of four turns of input-side coil 21A and a total of four turns of input-side coil 21B are thereby formed. In FIG. 9 (C), input-side coils 21A and 21B are connected in series.

Referring to FIG. 9 (D), also in the present embodiment, when the uppermost layer of four-layer patterns 20A to 20D of multilayer printed board 26 is seen in plan view, two output-side coils 22B and 22D are arranged on this plane as the same layer as pattern 20D of FIG. 3.

Output-side coil 22B is arranged to pass through the region extending in the vertical direction in FIG. 9 (D) between outer leg 23A1 and middle leg 23A3, the region extending in the vertical direction in FIG. 9 (D) between outer leg 23A2 and middle leg 23A3, and the region extending in the horizontal direction in FIG. 9 (D) and connecting these two regions. Output-side coil 22B is thereby in a mode of being spirally wound one turn around middle leg 23A3 (while being bent as if to draw the character of "C" in plan view), for example, as shown in the drawing.

Reference potential 7 is connected to one end of a pair of ends of output-side coil 22B, that is, one end (on the lower left side in FIG. 9 (D)) of the region interposed between outer leg 23A2 and middle leg 23A3. The anode of rectifier element 31B (second rectifier element) is connected in series with the other end of the pair of ends of output-side coil 22B, that is, one end (on the lower right side in FIG. 9 (D)) of the region interposed between outer leg 23A1 and middle leg 23A3.

Also similarly, output-side coil 22D is arranged to pass through the region extending in the vertical direction in FIG. 9 (D) between outer leg 23B1 and middle leg 23B3, the region extending in the vertical direction in FIG. 9 (D) between outer leg 23B2 and middle leg 23B3, and the region extending in the horizontal direction in FIG. 9 (D) and connecting these two regions. Output-side coil 22C is thereby in a mode of being spirally wound one turn around middle leg 23B3 (while being bent as if to draw the character of "C" in plan view), for example, as shown in the drawing.

Reference potential 7 is connected to one end of a pair of ends of output-side coil 22D, that is, one end (on the lower left side in FIG. 9 (D)) of the region interposed between outer leg 23B1 and middle leg 23B3. The anode of rectifier element 31D (fourth rectifier element) is connected in series with the other end of the pair of ends of output-side coil 22D, that is, one end (on the lower right side in FIG. 9 (D)) of the region interposed between outer leg 23B2 and middle leg 23B3.

Intermediate connection portion 32B extending in the horizontal direction in FIG. 9 (D) is arranged between output-side coil 22B extending in the horizontal direction in FIG. 9 (D) and output-side coil 22D extending in the horizontal direction in FIG. 9 (D). This intermediate connection portion 32B and output-side coils 22B, 22D extending in the horizontal direction in FIG. 9 (D) are configured to be continuous with each other and form a single linear shape. Intermediate connection portion 32B is a wiring region in which output-side coils 22B and 22D are electrically short-circuited.

Figure 10:
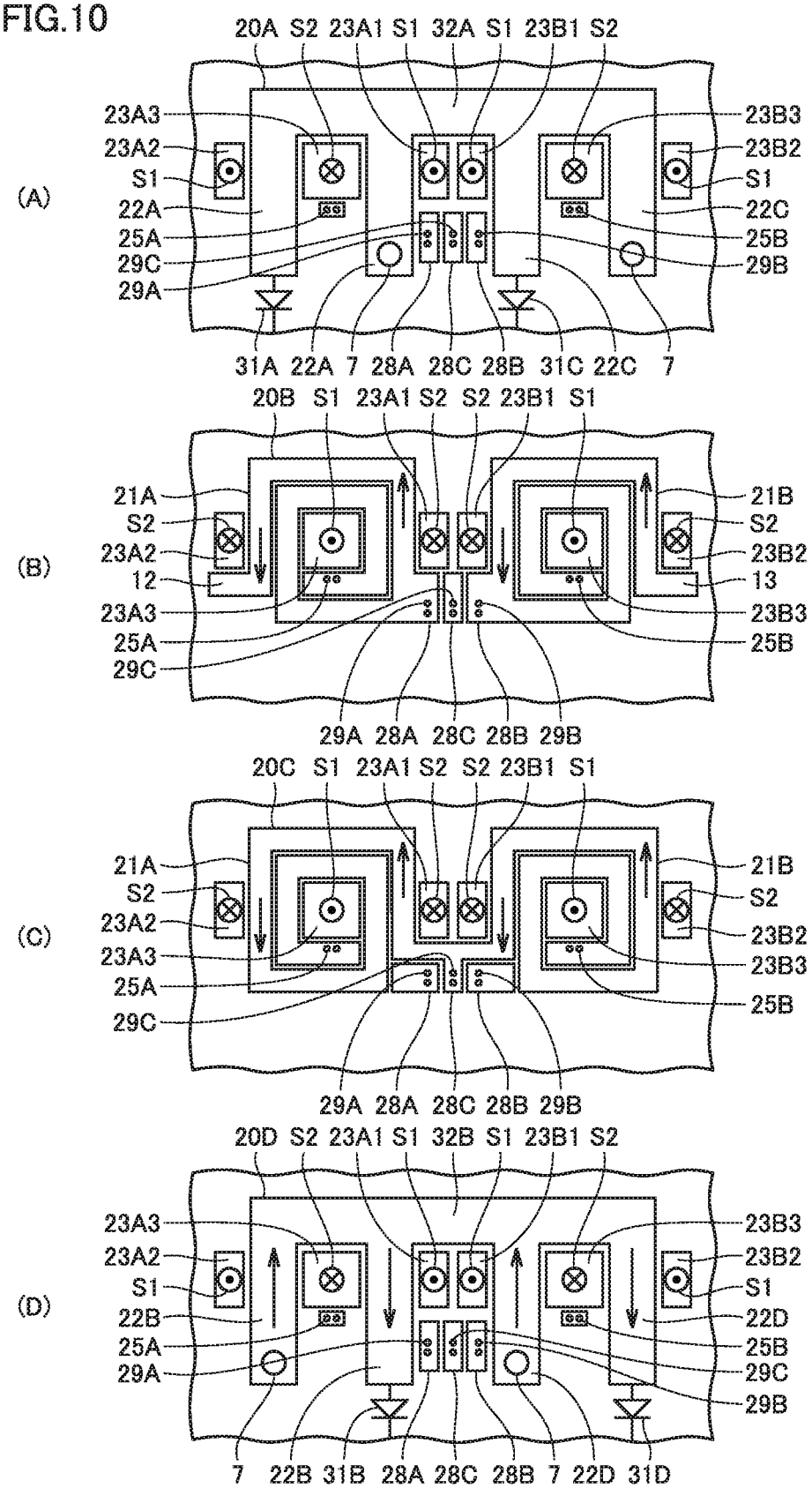

Referring to FIGS. 9 and 10, also in the present embodiment, similarly to the first embodiment, a voltage is applied to and electric current flows in input-side coil 21 in opposite directions to each other in the first state and the second state. The magnetic flux generated in each portion of E-shaped cores 23A and 23B is also in opposite directions to each other in the first state and the second state.

Figure 11:
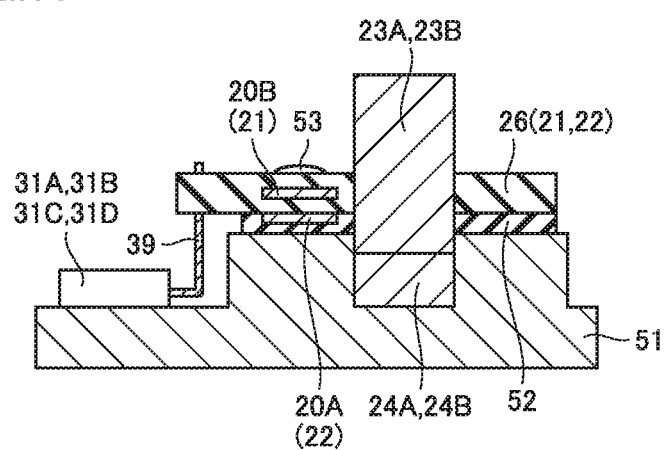
FIG. 11 is a schematic projection view seen from a direction XI indicated by the arrow in FIG. 8, upon assembly of the portion shown in FIG. 8 in the second embodiment.

Referring to FIG. 11, in a projection view seen from a direction XI indicated by the arrow in FIG. 8, the step-down transformer after assembly differs from FIG. 6 of the first embodiment in that E-shaped cores 23A and 23B, and rectifier elements 31A, 31B, 31C and 31D are each aligned linearly in the depth direction in FIG. 11. However, the remaining features, for example, the feature that radiator 51 is arranged so as to come into contact with at least a portion of the surface of each of step-down transformers 2A and 2B after assembly, the feature that heat generated by input-side coil 21 or output-side coil 22 of multilayer printed board 26 is transferred to radiator 51 through insulating sheet 52, and the feature that radiator 51 is used as reference potential 7, are basically similar to the first embodiment.

Since the configuration of the present embodiment is otherwise almost the same as that of the first embodiment, the same reference characters are allotted to the same elements, and the description thereof will not be repeated.

Next, the operation effects of the present embodiment will be described.

Also in the present embodiment, similarly to the first embodiment, the configuration is such that the intermediate portion of output-side coil 22A and the intermediate portion of output-side coil 22C are electrically connected, and the intermediate portion of output-side coil 22B and the intermediate portion of output-side coil 22D are electrically connected. Accordingly, similarly to the first embodiment, even if coupling unbalance occurs between the values of voltages applied to the two output-side coils included in one step-down transformer, the sum of current values of the output-side coils included in respective step-down transformers 2A and 2B can be made equal at all times. Accordingly, the current values of two smoothing coils 42A and 42B can be made equal, thereby reducing smoothing coils 42A and 42B in size.

Also in the present embodiment, similarly to the first embodiment, output-side coils 22A and 22C become equal in temperature at intermediate connection portion 32A, and output-side coils 22B and 22D become equal in temperature at intermediate connection portion 32B. Accordingly, thermal unbalance between two step-down transformers 2A and 2B can be suppressed. Step-down transformers 2A and 2B can thereby be reduced in size.

Third Embodiment

A third embodiment differs from the first embodiment in the following respects, but is otherwise basically similar to the first embodiment. First, a block diagram of a circuit constituting an insulation type step-down converter of the present embodiment will be described using FIG. 12.

Figure 12:
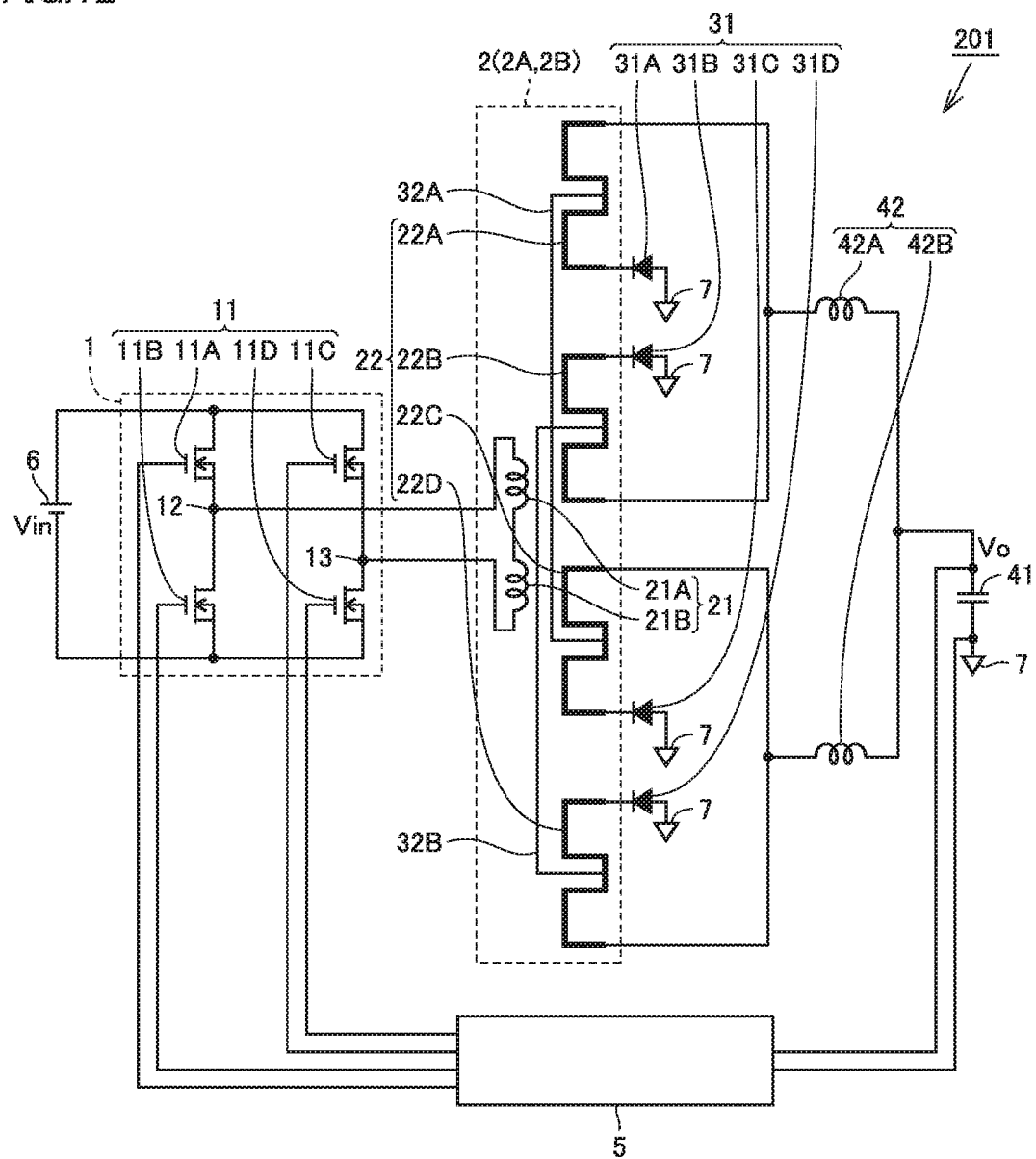
FIG. 12 is a circuit block diagram of an insulation type step-down converter of a third embodiment.

Referring to FIG. 12, an insulation type step-down converter 201 of the present embodiment mainly has, similarly to insulation type step-down converter 101 of the first embodiment, input-side drive circuit 1, step-down transformer 2 (2A and 2B), rectifier element 31, smoothing coil 42, and control circuit 5. Step-down transformers 2A and 2B have four output-side coils 22A, 22B, 22C, and 22D as output-side coil 22.

In the present embodiment, however, one end of a pair of ends of output-side coil 22A is connected to the cathode of rectifier element 31A, and the other end is connected to smoothing coil 42A. Similarly, one end of a pair of ends of output-side coil 22B is connected to the cathode of rectifier element 31B, and the other end is connected to smoothing coil 42A. One end of a pair of ends of output-side coil 22C is connected to the cathode of rectifier element 31C, and the other end is connected to smoothing coil 42B. One end of a pair of ends of output-side coil 22D is connected to the cathode of rectifier element 31D, and the other end is connected to smoothing coil 42B. The anode of each of rectifier elements 31A to 31D is connected to reference potential 7 on the output side of insulation type step-down converter 201.

Insulation type step-down converter 201 differs from insulation type step-down converter 101 in this respect, but is otherwise basically similar to insulation type step-down converter 101, and thus the description thereof will not be repeated here.

Next, the configuration of the pattern, that is, the input-side and output-side coils, of each layer, and the operation of the step-down transformer in the present embodiment will be described using FIGS. 13 to 14.

Figure 13:
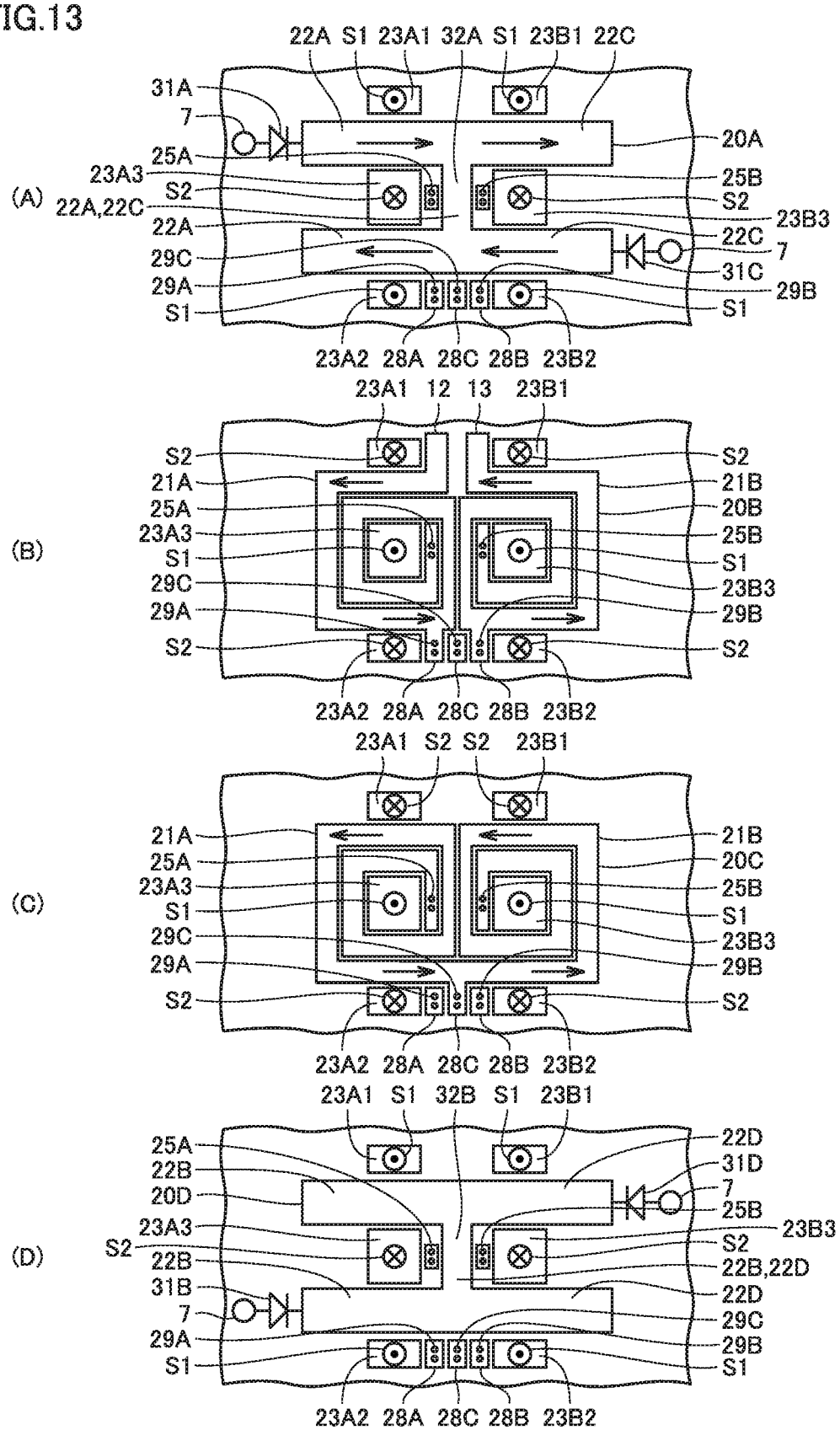

Referring to FIG. 13 (A), on the first layer which is the lowermost layer of four-layer patterns 20A to 20D of multilayer printed board 26 of the present embodiment, two output-side coils 22A and 22C having similar features such as shape and material to those of FIG. 4 (A) are arranged, and intermediate connection portion 32A serving as a short-circuit region of output-side coils 22A and 22C is formed at an intermediate portion of these coils. The mode of arrangement of E-shaped cores 23A and 23B in FIG. 13 (A) is also basically similar to that of FIG. 4 (A).

However, in FIG. 13 (A), rectifier element 31A and reference potential 7 are connected in series with one end of a pair of ends of output-side coil 22A, that is, one end (on the upper left side in FIG. 13 (A)) of the region interposed between outer leg 23A1 and middle leg 23A3. Smoothing coil 42A is connected, although not shown, to the other end of the pair of ends of output-side coil 22A, that is, one end (on the lower left side in FIG. 13 (A)) of the region interposed between outer leg 23A2 and middle leg 23A3.

Similarly, in FIG. 13 (A), rectifier element 31C and reference potential 7 are connected in series with one end of a pair of ends of output-side coil 22C, that is, one end (on the lower right side in FIG. 13 (A)) of the region interposed between outer leg 23B2 and middle leg 23B3. Smoothing coil 42B is connected, although not shown, to the other end of the pair of ends of output-side coil 22C, that is, one end (on the upper right side in FIG. 13 (A)) of the region interposed between outer leg 23B1 and middle leg 23B3.

Referring to FIGS. 13 (B) and (C), since all the features such as shape and material of input-side coils 21A and 21B illustrated in these drawings are similar to those of FIGS. 4 (B) and (C), and the directions of magnetic fluxes and electric currents are also similar to those of FIGS. 4 (B) and (C), a detailed description is omitted.

Referring to FIG. 13 (D), on the fourth layer which is the uppermost layer of four-layer patterns 20A to 20D of multilayer printed board 26 of the present embodiment, two output-side coils 22B and 22D having similar features such as shape and material to those of FIG. 4 (D) are arranged, and intermediate connection portion 32B serving as a short-circuit region of output-side coils 22B and 22D is formed at an intermediate portion of these coils.

However, in FIG. 13 (D), rectifier element 31B and reference potential 7 are connected in series with one end of a pair of ends of output-side coil 22B, that is, one end (on the lower left side in FIG. 13 (D)) of the region interposed between outer leg 23A2 and middle leg 23A3. Smoothing coil 42A is connected, although not shown, to the other end of the pair of ends of output-side coil 22B, that is, one end (on the upper left side in FIG. 13 (A)) of the region interposed between outer leg 23A1 and middle leg 23A3.

Similarly, in FIG. 13 (D), rectifier element 31D and reference potential 7 are connected in series with one end of a pair of ends of output-side coil 22D, that is, one end (on the upper right side in FIG. 13 (D)) of the region interposed between outer leg 23B1 and middle leg 23B3. Smoothing coil 42B is connected, although not shown, to the other end of the pair of ends of output-side coil 22D, that is, one end (on the lower right side in FIG. 13 (D)) of the region interposed between outer leg 23B2 and middle leg 23B3.

Figure 14:
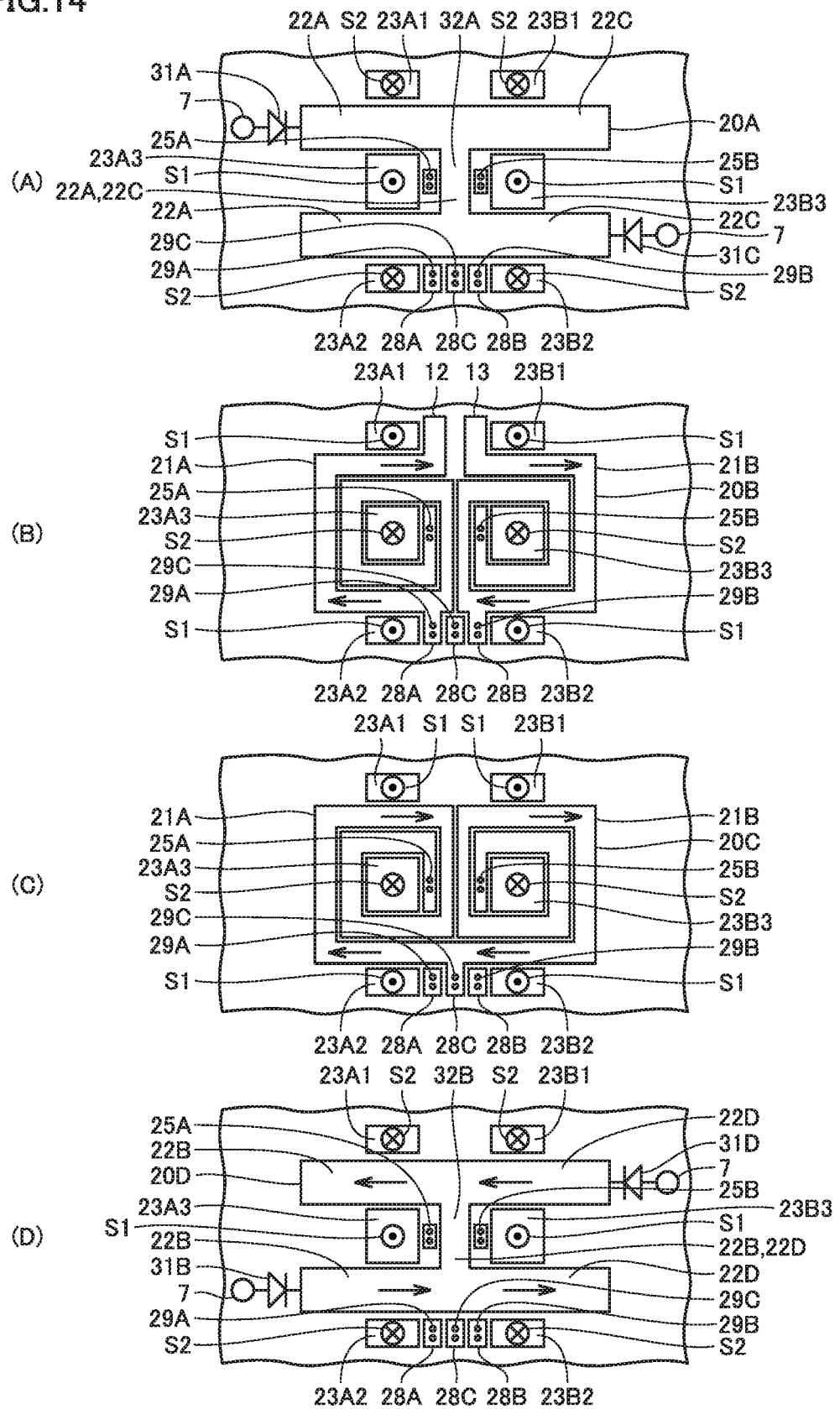

Referring to FIGS. 13 and 14, also in the present embodiment, similarly to the first embodiment, a voltage is applied to and electric current flows in input-side coil 21 in opposite directions to each other in the first state and the second state. The magnetic flux generated in each portion of E-shaped cores 23A and 23B is also in opposite directions to each other in the first state and the second state.

Since the configuration of the present embodiment is otherwise almost the same as that of the first embodiment, the same reference characters are allotted to the same elements, and the description thereof will not be repeated.

The operation effects of the present embodiment are basically similar to those of the first and second embodiments. That is, the current values of two smoothing coils 42A and 42B can be made equal, thereby reducing smoothing coils 42A and 42B in size. In addition, thermal unbalance between two step-down transformers 2A and 2B can be suppressed, thereby reducing step-down transformers 2A and 2B in size.

Fourth Embodiment

A fourth embodiment differs from the second embodiment in the following respects, but is otherwise basically similar to the second embodiment, and can be described with reference to the circuit block diagram of insulation type step-down converter 201 shown in FIG. 12. The configuration of the pattern, that is, the input-side and output-side coils, of each layer, and the operation of the step-down transformer in the present embodiment will be described using FIGS. 15 to 16.

Figure 15:
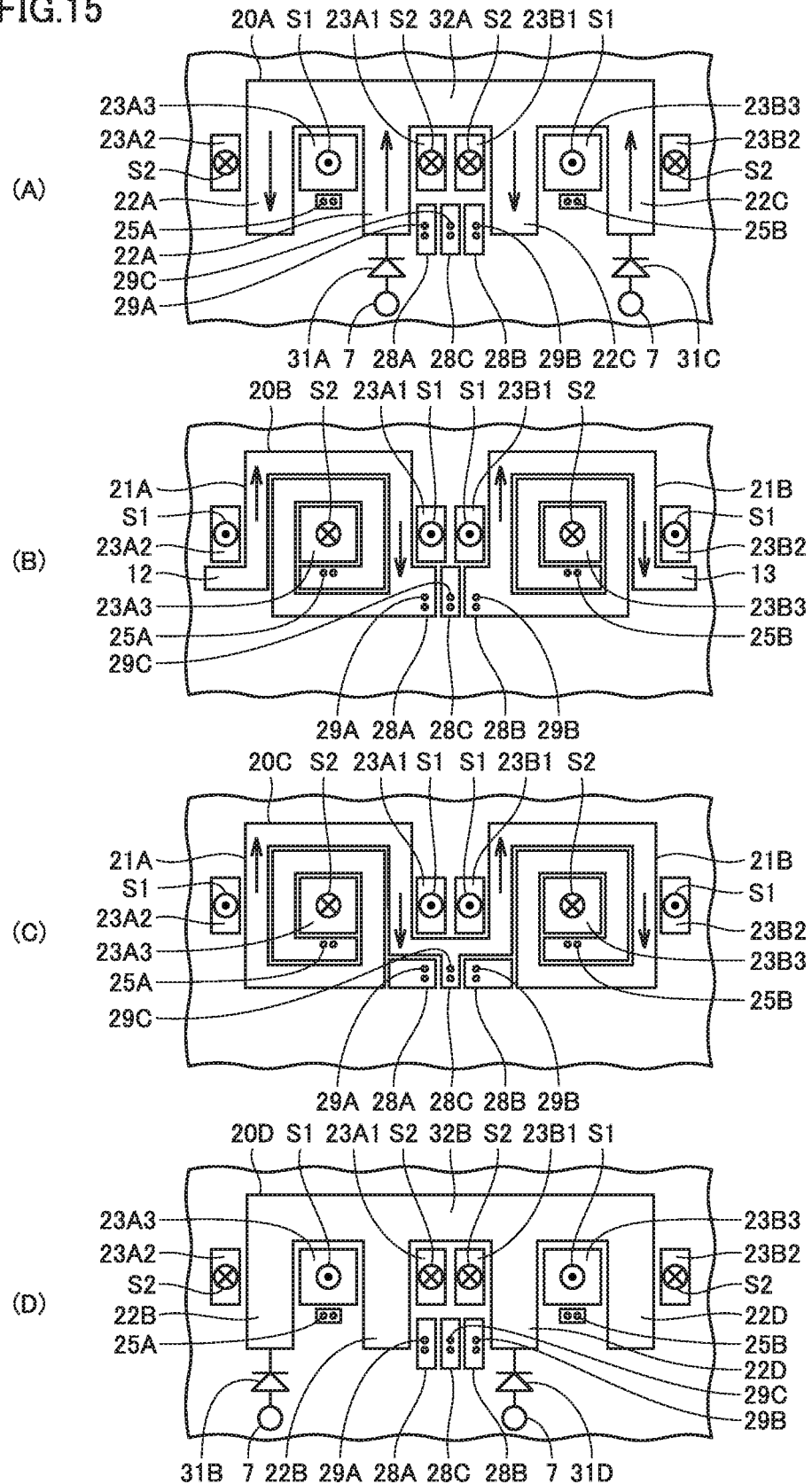

Referring to FIG. 15 (A), on the first layer which is the lowermost layer of four-layer patterns 20A to 20D of multilayer printed board 26 of the present embodiment, two output-side coils 22A and 22C having similar features such as shape and material to those of FIG. 9 (A) are arranged, and intermediate connection portion 32A serving as a short-circuit region of output-side coils 22A and 22C is connected at an intermediate portion of these coils. The mode of arrangement of E-shaped cores 23A and 23B in FIG. 15 (A) is also basically similar to that of FIG. 9 (A).

However, in FIG. 15 (A), rectifier element 31A and reference potential 7 are connected in series with one end of a pair of ends of output-side coil 22A, that is, one end (on the lower right side in FIG. 15 (A)) of the region interposed between outer leg 23A1 and middle leg 23A3. Smoothing coil 42A is connected, although not shown, to the other end of the pair of ends of output-side coil 22A, that is, one end (on the lower left side in FIG. 13 (A)) of the region interposed between outer leg 23A2 and middle leg 23A3.

Similarly, in FIG. 15 (A), rectifier element 31C and reference potential 7 are connected in series with one end of a pair of ends of output-side coil 22C, that is, one end (on the lower right side in FIG. 15 (A)) of the region interposed between outer leg 23B2 and middle leg 23B3. Smoothing coil 42B is connected, although not shown, to the other end of the pair of ends of output-side coil 22C, that is, one end (on the lower left side in FIG. 13 (A)) of the region interposed between outer leg 23B1 and middle leg 23B3.

Referring to FIGS. 15 (B) and (C), since all the features such as shape and material of input-side coils 21A and 21B illustrated in these drawings are similar to those of FIGS. 9 (B) and (C), and the directions of magnetic fluxes and electric currents are also similar to those of FIGS. 9 (B) and (C), a detailed description is omitted.

Referring to FIG. 15 (D), on the fourth layer which is the uppermost layer of four-layer patterns 20A to 20D of multilayer printed board 26 of the present embodiment, two output-side coils 22B and 22D having similar features such as shape and material to those of FIG. 9 (D) are arranged, and intermediate connection portion 32B serving as a short-circuit region of output-side coils 22B and 22D is formed at an intermediate portion of these coils.

However, in FIG. 15 (D), rectifier element 31B and reference potential 7 are connected in series with one end of a pair of ends of output-side coil 22B, that is, one end (on the lower left side in FIG. 15 (D)) of the region interposed between outer leg 23A2 and middle leg 23A3. Smoothing coil 42A is connected, although not shown, to the other end of the pair of ends of output-side coil 22B, that is, one end (on the lower right side in FIG. 15 (D)) of the region interposed between outer leg 23A1 and middle leg 23A3.

Similarly, in FIG. 15 (D), rectifier element 31D and reference potential 7 are connected in series with one end of a pair of ends of output-side coil 22D, that is, one end (on the lower left side in FIG. 15 (D)) of the region interposed between outer leg 23B1 and middle leg 23B3. Smoothing coil 42B is connected, although not shown, to the other end of the pair of ends of output-side coil 22D, that is, one end (on the lower right side in FIG. 15 (D)) of the region interposed between outer leg 23B2 and middle leg 23B3.

Figure 16:
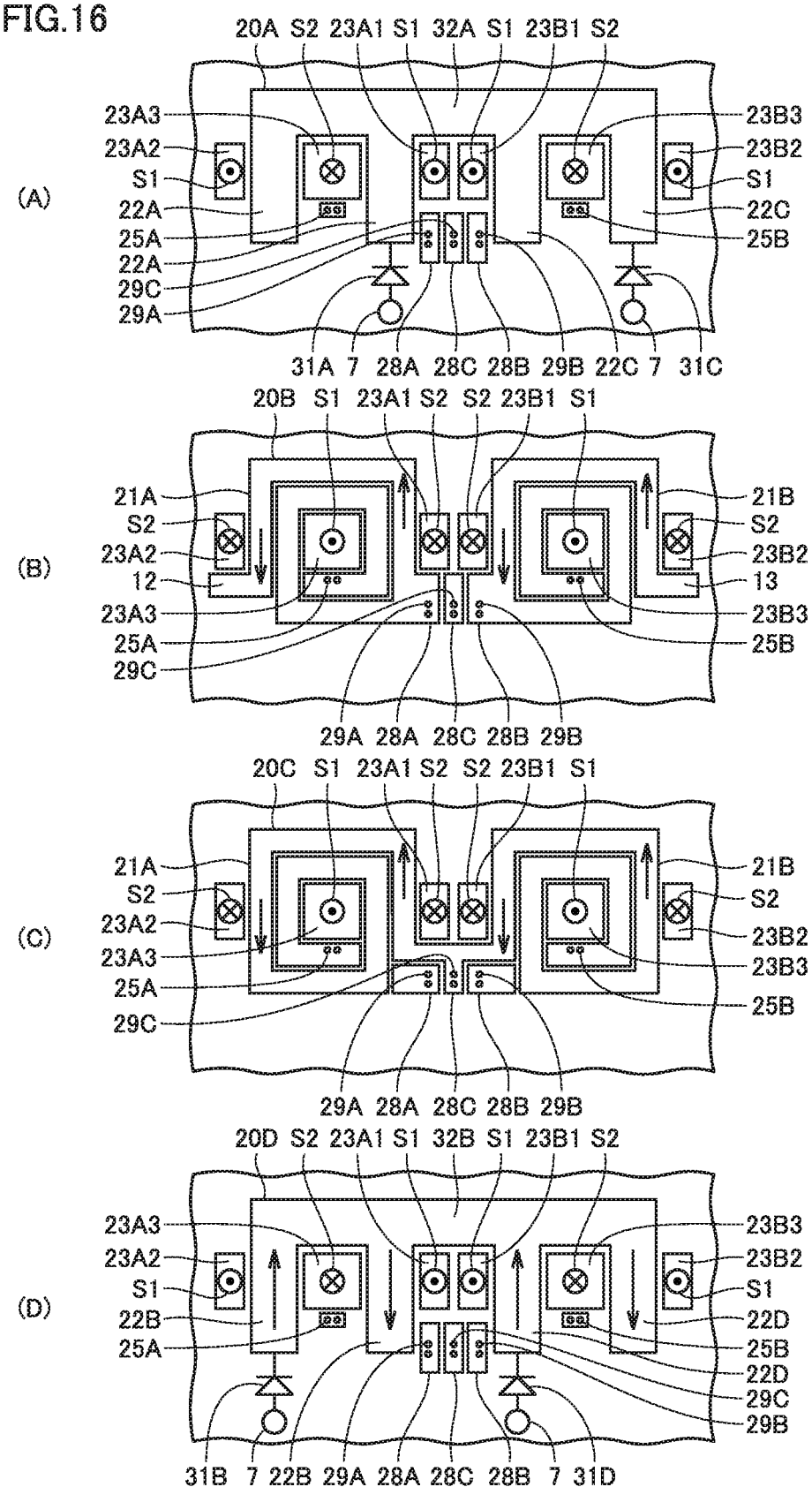

Referring to FIGS. 15 and 16, also in the present embodiment, similarly to the second embodiment, a voltage is applied to and electric current flows in input-side coil 21 in opposite directions to each other in the first state and the second state. The magnetic flux generated in each portion of E-shaped cores 23A and 23B is also in opposite directions to each other in the first state and the second state.

Since the configuration of the present embodiment is otherwise almost the same as that of the second embodiment, the same reference characters are allotted to the same elements, and the description thereof will not be repeated.

The operation effects of the present embodiment are basically similar to those of the first and second embodiments. That is, the current values of two smoothing coils 42A and 42B can be made equal, thereby reducing smoothing coils 42A and 42B in size. In addition, thermal unbalance between two step-down transformers 2A and 2B can be suppressed, thereby reducing step-down transformers 2A and 2B in size.

Fifth Embodiment

A fifth embodiment differs from the first embodiment in the following respects, but is otherwise basically similar to the first embodiment, and can be described with reference to the circuit block diagram of insulation type step-down converter 101 shown in FIG. 1. First, an overall structure of step-down transformer 2 will be briefly described using FIGS. 17 to 18.

Figure 18:
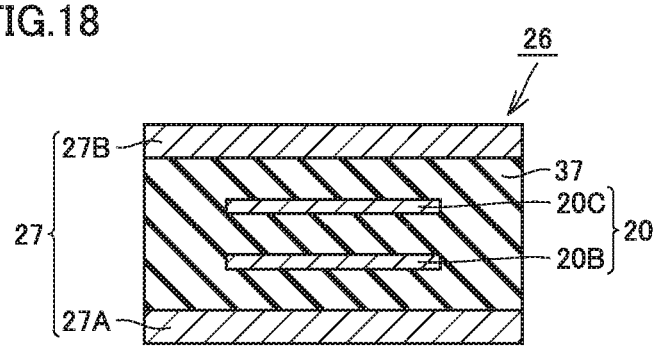
FIG. 18 is a schematic sectional view showing the configuration of the multilayer printed board at a portion taken along the line XVIII-XVIII in FIG. 17, after final assembly.

Referring to FIGS. 17 to 18, step-down transformer 2 of the present embodiment basically has a similar overall structure to step-down transformer 2 of the first embodiment shown in FIGS. 2 to 3. However, in the present embodiment, a metal plate 27A and a metal plate 27B (collectively called a metal plate 27), each as a flat plate component made of copper, for example, are arranged as output-side coils 22 of the first layer as the lowermost layer and the fourth layer as the uppermost layer in the coils formed in four-layer multilayer printed board 26.

Referring to FIG. 18, metal plates 27A and 27B are formed to come into contact with the lowermost surface and uppermost surface of substrate body 37, respectively, similarly to patterns 20A and 20D in FIG. 3.

Referring to FIG. 18, metal plates 27A and 27B are formed thicker than patterns 20B and 20C. Metal plates 27A and 27B may be formed to have a width longer than the width of multilayer printed board 26 in the depth direction in FIG. 17, that is, to protrude from the both ends of multilayer printed board 26 in the depth direction in FIG. 17. It is noted that, as shown in FIG. 18, metal plates 27A and 27B and patterns 20B and 20C are spaced from each other by substrate body 37 of an insulating material (so as not to be short-circuited to each other), similarly to the first embodiment.

Figure 19:
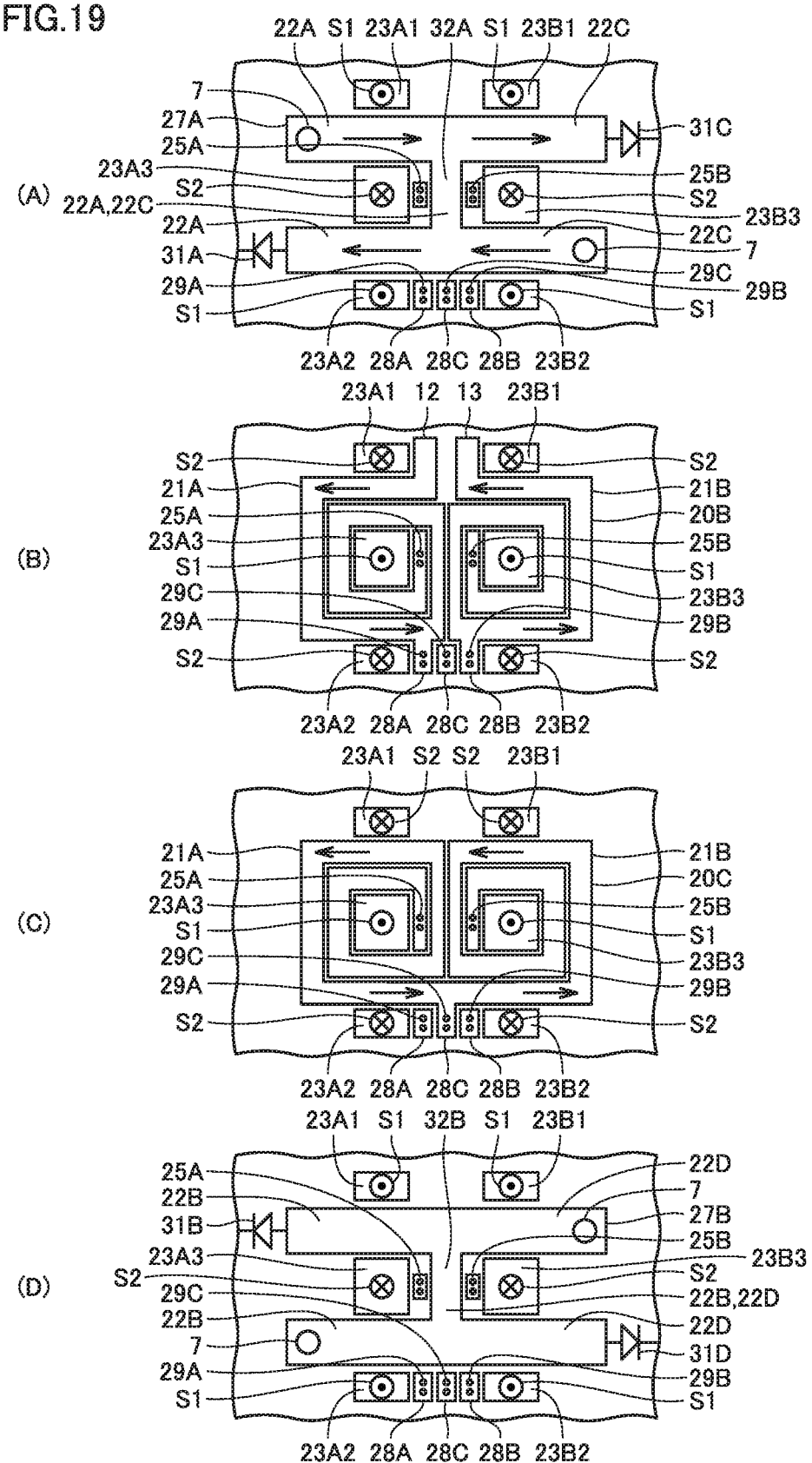
Figure 20:
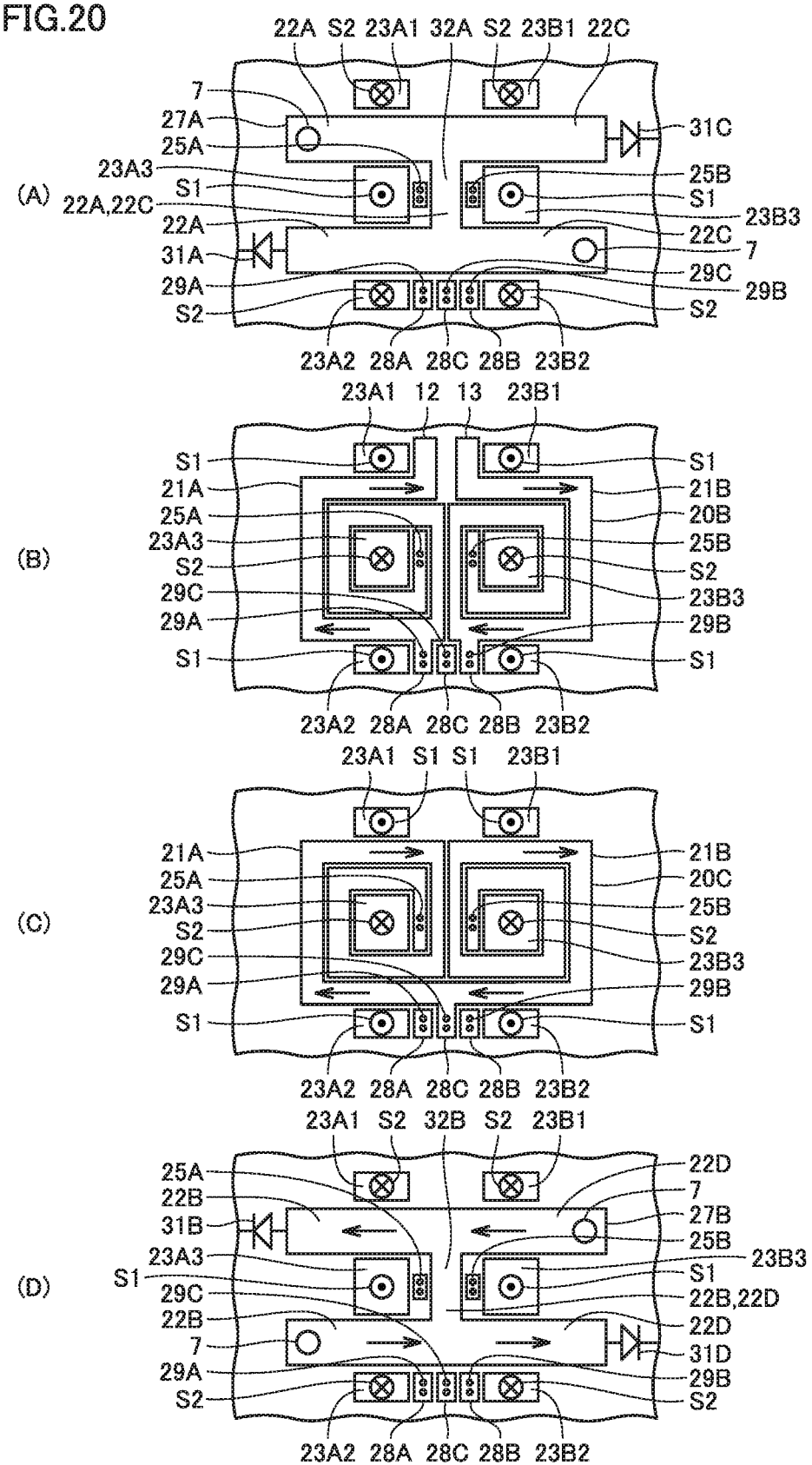
FIG. 20 shows a schematic diagram (A) showing a pattern of the lowermost layer of the input-side and output-side coils constituting the step-down transformer of the fifth embodiment, and a direction of a magnetic flux when the input-side drive circuit is in a second state, a schematic diagram (B)

Referring to FIGS. 19 to 20, the plane shape of the pattern of coils 21 and 22 of each layer, the mode of connection of reference potential 7 and rectifier elements 31A to 31D, and the directions of a magnetic flux and electric current in each state in the present embodiment are basically similar to the pattern of coils 21 and 22 of each layer of multilayer printed board 26 in the first embodiment shown in FIGS. 4 and 5. Thus, a detailed description of each part is omitted. However, as described above, output-side coils 22A and 22C in FIG. 19 (A) and FIG. 20 (A) are each formed of metal plate 27A instead of being formed as pattern 20A which is a metallic thin film pattern. In addition, output-side coils 22B and 22D in FIG. 19 (D) and FIG. 20 (D) are each formed of metal plate 27B instead of being formed as pattern 20D which is a metallic thin film pattern.

That is, referring to FIGS. 17 to 20, output-side coils 22A and 22C of the first layer are formed of metal plate 27A such as a copper plate, and output-side coils 22B and 22D of the fourth layer are formed of metal plate 27B such as a copper plate, in four-layer multilayer printed board 26. It is noted that aluminum or the like may be used instead of copper as metal plates 27A and 27B. In this regard, the present embodiment differs from the first embodiment in which the first layer as the lowermost layer and the fourth layer as the uppermost layer as described above are formed as copper thin film patterns 20A and 20D.

Referring to FIG. 19 (B), (C) and FIG. 20 (B), (C), however, also in the present embodiment, metallic (copper) thin film patterns similar to those in the first and third embodiments are formed as pattern 20B of the second lowermost layer and pattern 20C of the third lowermost layer in the coils formed in four-layer multilayer printed board 26.

Radiation patterns 28A to 28C shown in FIG. 19 (A) to (D) and FIG. 20 (A) to (D) are formed as copper thin film patterns similarly to the other embodiments. However, at least in the layers on which metal plates 27A and 27B are formed as shown in FIGS. 19 (A) and (D), a copper thin film pattern is not formed in regions overlapping the regions in which metal plates 27A and 27B are formed.

Referring now to FIG. 21, the radiation path of the above-described step-down transformer is described.

Referring to FIG. 21, since a projection view seen from a direction XXI indicated by the arrow in FIG. 17 is basically similar in configuration and operation effects to the first embodiment shown in FIG. 6, the same reference characters are allotted to the same elements as those in FIG. 6 and the description thereof is omitted. However, there are differences in the following respects.

In FIG. 21, output-side coil 22 is not thin film pattern 20A shown in FIG. 6 or the like, but is metal plates 27A and 27B. As a path to transfer heat generated by output-side coil 22 to radiator 51, first, there is a transfer path from output-side coil 22 to radiator 51 through insulating sheets 52A, 52B, and 52C. There is also a path to transfer electricity and heat from output-side coil 22 to radiator 51 (which corresponds to reference potential 7) through screws that are not shown. That is, there are above-described two paths: one through the insulating sheets; and the other through the screws. It is noted that there are above-described three paths similar to those in the first embodiment to transfer heat generated by input-side coil 21 to radiator 51.

Next, the operation effects of the present embodiment will be described. In addition to the operation effects of the first embodiment, the present embodiment can produce the following operation effects.

Since output-side coil 22 is formed of metal plates 27A and 27B as flat plate components made of copper in the present embodiment, the thickness becomes larger than in the case in which output-side coil 22 is formed as a thin film pattern. It is therefore possible to increase the current-carrying cross section of output-side coil 22 of the present embodiment. Accordingly, even if the output current of the insulation type step-down converter increases to increase electric current in output-side coil 22, the amount of heat generated by output-side coil 22 can be reduced in the present embodiment.

In the present embodiment, it is more preferable that two metal plates 27A and 27B have the same shape and size equal in plane shape and thickness to each other. Manufacturing costs of metal plates 27A and 27B can thereby be made lower than in the case in which metal plates 27A and 27B have different shapes and sizes.

Sixth Embodiment

A sixth embodiment differs from the second embodiment in the following respects, but is otherwise basically similar to the second embodiment, and can be described with reference to the circuit block diagram of insulation type step-down converter 101 shown in FIG. 1. First, an overall structure of step-down transformer 2 will be briefly described using FIG. 22.

Referring to FIG. 22, step-down transformer 2 of the present embodiment basically has a similar overall structure to step-down transformer 2 of the second embodiment shown in FIG. 8. However, in the present embodiment, metal plate 27A and metal plate 27B (collectively called metal plate 27), each as a flat plate component made of copper, for example, are arranged as output-side coils 22 of the first layer as the lowermost layer and the fourth layer as the uppermost layer in the coils formed in four-layer multilayer printed board 26.

Referring to FIGS. 23 to 24, the plane shape of the pattern of coils 21 and 22 of each layer, the mode of connection of reference potential 7 and rectifier elements 31A to 31D, and the directions of a magnetic flux and electric current in each state in the present embodiment are basically similar to the pattern of coils 21 and 22 of each layer of multilayer printed board 26 in the second embodiment shown in FIGS. 9 and 10. Thus, a detailed description of each part is omitted. However, as described above, output-side coils 22A and 22C in FIG. 23 (A) and FIG. 24 (A) are each formed of metal plate 27A instead of being formed as pattern 20A which is a metallic thin film pattern. In addition, output-side coils 22B and 22D in FIG. 23 (D) and FIG. 24 (D) are each formed of metal plate 27B instead of being formed as pattern 20D which is a metallic thin film pattern.

That is, referring to FIGS. 22 to 24, output-side coils 22A and 22C of the first layer are formed of metal plate 27A such as a copper plate, and output-side coils 22B and 22D of the fourth layer are formed of metal plate 27B such as a copper plate, in four-layer multilayer printed board 26. It is noted that aluminum or the like may be used instead of copper as metal plates 27A and 27B. In this regard, the present embodiment differs from the second embodiment in which the first layer as the lowermost layer and the fourth layer as the uppermost layer as described above are formed as copper thin film patterns 20A and 20D.

Referring to FIG. 23 (B), (C) and FIG. 24 (B), (C), however, also in the present embodiment, metallic (copper) thin film patterns similar to those in the second and fourth embodiments are formed as pattern 20B of the second lowermost layer and pattern 20C of the third lowermost layer in the coils formed in four-layer multilayer printed board 26.

Radiation patterns 28A to 28C shown in FIG. 23 (A) to (D) and FIG. 24 (A) to (D) are formed as copper thin film patterns similarly to the other embodiments. However, at least in the layers on which metal plates 27A and 27B are formed as shown in FIGS. 23 (A) and (D), a copper thin film pattern is not formed in regions overlapping the regions in which metal plates 27A and 27B are formed.

Referring to FIG. 25, since the radiation path of the above-described step-down transformer (a projection view seen from a direction XXV indicated by the arrow in FIG. 22) is basically similar in configuration and operation effects to the second embodiment shown in FIG. 11, the same reference characters are allotted to the same elements as those in FIG. 11 and the description thereof is omitted. In addition, since the differences between FIGS. 25 and 11 are also basically similar to the differences between FIGS. 21 and 6 in the fifth embodiment, the description thereof is omitted here.

Since the present embodiment basically produces similar operation effects to those of the fifth embodiment, the description of the operation effects is omitted.

Seventh Embodiment

A seventh embodiment differs from the first embodiment in the following respects, but is otherwise basically similar to the first embodiment. A block diagram of a circuit constituting an insulation type step-down converter of the present embodiment will be described below using FIG. 26.

Referring to FIG. 26, an insulation type step-down converter 301 of the present embodiment basically has a similar configuration to insulation type step-down converter 101 of the first embodiment. However, output-side coils 22A and 22C are connected to (first) smoothing coil 42A, and output-side coils 22B and 22D are connected to (second) smoothing coil 42B. Accordingly, electric currents flowing in output-side coils 22A and 22C flow to smoothing coil 42A, and electric currents flowing in output-side coils 22B and 22D flow to smoothing coil 42B.

In this regard, the present embodiment differs from the configuration of the first embodiment in which output-side coils 22A and 22B are connected to (first) smoothing coil 42A, and output-side coils 22C and 22D are connected to (second) smoothing coil 42B. However, the present embodiment is otherwise basically similar to the first embodiment, and the pattern of each layer is basically similar to FIGS. 4 and 5. Thus, the same reference characters are allotted to the same elements, and the description thereof will not be repeated.

With such mode of connection as in the present embodiment, similar operation effects to those of the first embodiment can be produced. That is, each of smoothing coils 42A and 42B is connected to any two of four output-side coils 22A to 22D. Specifically, in the first embodiment (FIG. 1), smoothing coil 42A is connected to output-side coils 22A and 22B, and smoothing coil 42B is connected to output-side coils 22C and 22D. In contrast, in the seventh embodiment (FIG. 26), smoothing coil 42A is connected to output-side coils 22A and 22C, and smoothing coil 42B is connected to output-side coils 22B and 22D.

The mode of the present embodiment can be applied in combination with any one of the embodiments described above. For example, the present embodiment can be applied to the configuration of the second embodiment, or the present embodiment can be applied to the configuration having metal plates 27A and 27B.

Eighth Embodiment

An eighth embodiment differs from the second embodiment in the following respects, but is otherwise basically similar to the second embodiment. The configuration of the pattern, that is, the input-side and output-side coils, of each layer in the present embodiment will be described below using FIGS. 27 and 28.

Referring to FIG. 27 (A) to (D) and FIG. 28 (A) to (D), also in the present embodiment, the intermediate portion of output-side coil 22A and the intermediate portion of output-side coil 22C are electrically connected by intermediate connection portion 32A, and the intermediate portion of output-side coil 22B and the intermediate portion of output-side coil 22D are electrically connected by intermediate connection portion 32B. However, output-side coil 22A is arranged on the lowermost layer (first layer) of four-layer patterns 20A to 20D of multilayer printed board 26 (see FIG. 3) shown in FIG. 27 (A), whereas output-side coil 22C is arranged on the uppermost layer (fourth layer) of above-described four-layer patterns 20A to 20D shown in FIG. 27 (D). In addition, output-side coil 22D is arranged on the lowermost layer (first layer) of four-layer patterns 20A to 20D of multilayer printed board 26 (see FIG. 3) shown in FIG. 27 (A), whereas output-side coil 22B is arranged on the uppermost layer (fourth layer) of above-described four-layer patterns 20A to 20D shown in FIG. 27 (D).

In this way, in the present embodiment, the two output-side coils connected to each other at their intermediate portions are arranged on layers different from each other. Intermediate connection portion 32A of output-side coils 22A and 22C is electrically connected by connection vias 33A interposed between the layer on which output-side coil 22A is arranged and the layer on which output-side coil 22C is arranged, which are layers different from each other. Intermediate connection portion 32B of output-side coils 22B and 22D is electrically connected through connection vias 33B interposed between the layer on which output-side coil 22B is arranged and the layer on which output-side coil 22D is arranged, which are layers different from each other.

The present embodiment differs in the above-described respect from the configuration of the second embodiment in which the two output-side coils connected to each other at their intermediate portions are arranged on the same layer, but is otherwise basically similar to the second embodiment. For example, the modes of FIG. 27 (B), (C) and FIG. 28 (B), (C) are identical to the modes of FIG. 9 (B), (C) and FIG. 10 (B), (C), respectively. In addition, the present embodiment can be described, for example, with reference to the circuit block diagram of insulation type step-down converter 101 shown in FIG. 1. Thus, the same reference characters are allotted to the same elements, and the description thereof will not be repeated.

Next, the operation effects of the present embodiment will be described. In addition to the operation effects similar to those of the first and second embodiments, the present embodiment produces the following operation effects.

In the present embodiment, both of a set of output-side coils 22A and 22C connected to each other at their intermediate portions and a set of output-side coils 22B and 22D connected to each other at their intermediate portions are at least partly formed on the lowermost layer (first layer). Accordingly, the present embodiment produces an operation effect of cooling both of the above-described sets more easily (than output-side coils 22B and 22D of the uppermost layer in the second embodiment) by heat radiation of radiator 51 therebelow, through insulating sheet 52 arranged immediately below the lowermost layer (first layer).

The mode of the present embodiment can be applied in combination with any one of the embodiments described above. For example, the present embodiment can be applied to the configuration of the first embodiment, or the present embodiment can be applied to the configuration having metal plates 27A and 27B.

Ninth Embodiment

Referring to FIG. 29 (A) to (D), an insulation type step-down converter of the present embodiment basically has a similar configuration to the first embodiment (FIG. 4 (A) to (D)). However, in this case, pattern 20A of the first layer and pattern 20B of the second layer of multilayer printed board 26 (see FIG. 3) are the same as those in FIGS. 4 (A) and (B), but the configuration of pattern 20C of the third layer and pattern 20D of the fourth layer is reversed relative to FIGS. 4 (C) and (D). That is, the same output-side coils 22B and 22D as those in FIG. 4 (D) correspond to pattern 20C of the third layer shown in FIG. 29 (C), and the same input-side coils 21A and 21B as those in FIG. 4 (C) correspond to pattern 20D of the fourth layer shown in FIG. 29 (D).

That is, in the present embodiment, patterns 20A, 20B, 20C, and 20D are stacked in this order so as to correspond to an output-side coil, an input-side coil, an output-side coil, and an input-side coil, respectively. However, this is not a limitation, and although not shown, patterns 20A, 20B, 20C, and 20D may be stacked in this order so as to correspond to an output-side coil, an output-side coil, an input-side coil, and an input-side coil, respectively, for example.

The present embodiment differs from the first embodiment only in the order of stacking of the respective layers, and the mode of each layer in FIG. 29 is identical to any of FIG. 4 (A) to (D). Therefore, in the present embodiment, the operations in the above-described first and second states are similar to those of the first embodiment shown in FIGS. 4 and 5.

Since the configuration of the present embodiment is otherwise almost the same as that of the first embodiment, the same reference characters are allotted to the same elements, and the description thereof will not be repeated.

The mode of the present embodiment can be applied in combination with any one of the embodiments described above. For example, the present embodiment can be applied to the configuration of the second embodiment, or the present embodiment can be applied to the configuration having metal plates 27A and 27B.

The characteristics described in (the respective examples included in) the respective embodiments described above can be applied in appropriate combination within the range where technical inconsistency does not occur.

It should be understood that the embodiments disclosed herein are illustrative and non-restrictive in every respect. The scope of the present invention is defined by the claims, not by the description above, and is intended to include any modification within the meaning and scope equivalent to the terms of the claims.

REFERENCE SIGNS LIST 1 input-side drive circuit; 2, 2A, 2B step-down transformer; 5 control circuit; 6 DC power supply; 7 reference potential; 11, 11A, 11B, 11C, 11D switching element; 12, 13 node; 21, 21A, 21B input-side coil; 22, 22A, 22B, 22C, 22D output-side coil; 23A, 23B E-shaped core; 23A1, 23A2, 23B1, 23B2 outer leg; 23A3, 23B3 middle leg; 24A, 24B I-shaped core; 25A, 25B, 33A, 33B connection via; 26 multilayer printed board; 28A, 28B, 28C radiation pattern; 29A, 29B, 29C radiation via; 31, 31A, 31B, 31C, 31D rectifier element; 32A, 32B intermediate connection portion; 39 wire; 42, 42A, 42B smoothing coil; 101, 201, 301 insulation type step-down converter.

The invention claimed is:
1. An insulation type step-down converter comprising first and second step-down transformers aligned with each other, the first step-down transformer including
a first core including a first middle leg, a first one outer leg spaced from the first middle leg and arranged to extend in a direction identical to the first middle leg, and a first other outer leg spaced from the first middle leg opposite to the first one outer leg,
a first input-side coil wound around the first middle leg of the first core, and first and second output-side coils wound around the first middle leg of the first core, overlapping at least part of the first input-side coil and spaced from each other, the second step-down transformer including
a second core including a second middle leg, a second one outer leg spaced from the second middle leg and arranged to extend in a direction identical to the second middle leg, and a second other outer leg spaced from the second middle leg opposite to the second one outer leg,
a second input-side coil wound around the second middle leg of the second core, and
third and fourth output-side coils wound around the second middle leg of the second core, overlapping at least part of the second input-side coil and spaced from each other, the insulation type step-down converter further comprising:
a first rectifier element connected in series with the first output-side coil;
a second rectifier element connected in series with the second output-side coil;
a third rectifier element connected in series with the third output-side coil;
a fourth rectifier element connected in series with the fourth output-side coil; and
first and second smoothing coils each connected to two of the serial connections between the first to fourth output-side coils and the first to fourth rectifier elements,
the first output-side coil includes a first end connected to a reference potential and a second end located opposite to the first end and connected to the first rectifier element, the second output-side coil includes a first end connected to the reference potential and a second end located opposite to the first end and connected to the second rectifier element, the third output-side coil includes a first end connected to the reference potential and a second end located opposite to the first end and connected to the third rectifier element, the fourth output-side coil includes a first end connected to the reference potential and a second end located opposite to the first end and connected to the fourth rectifier element, and each of the first, second, third and fourth output-side coils has an intermediate portion at a part of a path from the first end toward the second end,
the intermediate portion of the first output-side coil and the intermediate portion of the third output-side coil being connected to each other,
the intermediate portion of the second output-side coil and the intermediate portion of the fourth output-side coil being connected to each other,
the first, second, third, and fourth rectifier elements being connected such that electric currents flow simultaneously in the first output-side coil and the third output-side coil, and electric currents flow simultaneously in the second output-side coil and the fourth output-side coil in a manner alternating with the electric currents in the first output-side coil and the third output-side coil, so as to cancel out magnetic fluxes passing through the middle legs each time when electric current flowing in the first and second input-side coils is changed in direction.

2. The insulation type step-down converter according to claim 1, wherein
the first output-side coil and the third output-side coil are integrated and partly shared with each other, and the second output-side coil and the fourth output-side coil are integrated and partly shared with each other.

3. The insulation type step-down converter according to claim 1, wherein
the first output-side coil, the third output-side coil, and a connection portion connecting the intermediate portion of the first output-side coil and the intermediate portion of the third output-side coil are arranged on an identical layer, and
the second output-side coil, the fourth output-side coil, and a connection portion connecting the intermediate portion of the second output-side coil and the intermediate portion of the fourth output-side coil are arranged on an identical layer.

4. The insulation type step-down converter according to claim 1, further comprising a multilayer printed board having a plurality of patterns stacked therein, wherein
the first, second, third and fourth output-side coils are arranged as the plurality of stacked patterns included in the multilayer printed board,
the first output-side coil and the third output-side coil are arranged on layers different from each other, and the intermediate portion of the first output-side coil and the intermediate portion of the third output-side coil are connected to each other by a via interposed between the different layers, and
the second output-side coil and the fourth output-side coil are arranged on layers different from each other, and the intermediate portion of the second output-side coil and the intermediate portion of the fourth output-side coil are connected to each other by a via interposed between the different layers.

5. The insulation type step-down converter according to claim 1, further comprising an input-side drive circuit configured to apply voltages to the first and second input-side coils alternately in directions opposite to each other at regular time intervals.

6. The insulation type step-down converter according to claim 1, further comprising:
a radiator arranged to come into contact with the first and second step-down transformers; and
an insulating component arranged between the radiator and at least one of the first and second input-side coils and at least one of the first, second, third, and fourth output-side coils, wherein
heat generated by at least one of the first and second input-side coils and at least one of the first, second, third, and fourth output-side coils is transferred to the radiator through the insulating component.

7. The insulation type step-down converter according to claim 6, wherein
at least one of the first, second, third, and fourth output-side coils is arranged between the radiator and at least one of the first and second input-side coils, and
the radiator is arranged as the reference potential of an output-side circuit including the first, second, third, and fourth output-side coils of the first and second step-down transformers.

8. The insulation type step-down converter according to claim 6, wherein
the radiator comes into contact with an intermediate portion between the first output-side coil and the third output-side coil or an intermediate portion between the second output-side coil and the fourth output-side coil, through the insulating component.

9. The insulation type step-down converter according to claim 1, wherein
each of the first, second, third, and fourth output-side coils is formed as a flat plate component made of copper.

* * * * *